US012633330B2

(12) United States Patent
Tran et al.

(10) Patent No.: US 12,633,330 B2
(45) Date of Patent: May 19, 2026

(54) MAGNETIC MEMORY DEVICE AND METHOD FOR USING THE SAME

(71) Applicant: Avalanche Technology, Inc., Fremont, CA (US)

(72) Inventors: Thinh Tran, Palo Alto, CA (US); Ebrahim Abedifard, San Jose, CA (US)

(73) Assignee: Avalanche Technology, Inc., Fremont, CA (US)

( * ) Notice: Subject to any disclaimer, the term of this patent is extended or adjusted under 35 U.S.C. 154(b) by 144 days.

(21) Appl. No.: 18/761,264

(22) Filed: Jul. 1, 2024

(65) Prior Publication Data

US 2026/0004834 A1 Jan. 1, 2026

(51) Int. Cl.
*G11C 11/16* (2006.01)

(52) U.S. Cl.
CPC ...... *G11C 11/1673* (2013.01); *G11C 11/1659* (2013.01); *G11C 2207/2254* (2013.01)

(58) Field of Classification Search
CPC .............................. G11C 11/1673; G11C 11/16
USPC .................................................. 365/189.011
See application file for complete search history.

(56) References Cited

U.S. PATENT DOCUMENTS

| | | | |
|---|---|---|---|
| 6,369,740 B1 * | 4/2002 | Swanson ............... | H03M 1/208 |
| | | | 341/118 |
| 7,239,537 B2 | 7/2007 | Debrosse et al. | |

| | | | |
|---|---|---|---|
| 8,213,215 B2 | 7/2012 | Chen et al. | |
| 9,384,791 B1 | 7/2016 | Chan et al. | |
| 9,437,257 B2 | 9/2016 | Yang et al. | |
| 10,311,919 B2 | 6/2019 | Schippers | |
| 10,453,532 B1 | 10/2019 | Antonyan | |
| 10,622,066 B2 | 4/2020 | Antonyan | |
| 11,211,107 B1 * | 12/2021 | Tran .................... | G11C 11/1659 |
| 11,289,142 B2 | 3/2022 | Tran et al. | |
| 2004/0085122 A1 | 5/2004 | Perner et al. | |
| 2004/0240255 A1 | 12/2004 | Smith et al. | |
| 2009/0002018 A1 * | 1/2009 | Jeong .................... | H04L 25/028 |
| | | | 326/30 |
| 2010/0073069 A1 | 3/2010 | Wang et al. | |
| 2014/0016404 A1 * | 1/2014 | Kim ...................... | G11C 11/165 |
| | | | 365/158 |
| 2014/0321195 A1 | 10/2014 | Antonyan | |
| 2019/0043590 A1 | 2/2019 | Besinga et al. | |
| 2019/0088322 A1 | 3/2019 | Pyo et al. | |

(Continued)

*Primary Examiner* — Muna A Techane
(74) *Attorney, Agent, or Firm* — Bing K. Yen

(57) ABSTRACT

A method for calibrating a read circuit of a magnetic memory device comprising the steps of setting resistances of first and second target resistors to a same value; setting resistances of first and second calibration resistors to a same minimum value; flowing a reference current through the first target resistor, the first calibration resistor, and a first input terminal of a sense amplifier in series; flowing a calibration current through the second target resistor, the second calibration resistor, and a second input terminal of the sense amplifier in series; determining a potential difference between the first and second input terminals; and if the second input terminal has a higher potential, incrementally increasing the resistance of the second calibration resistor until the first input terminal has a higher potential, or else incrementally increasing the resistance of the first calibration resistor until the second input terminal has a higher potential.

20 Claims, 12 Drawing Sheets

(56) References Cited

U.S. PATENT DOCUMENTS

| | | |
|---|---|---|
| 2019/0348096 A1 | 11/2019 | Antonyan et al. |
| 2020/0090724 A1 | 3/2020 | Antonyan et al. |
| 2020/0194068 A1 | 6/2020 | Antonyan |

* cited by examiner

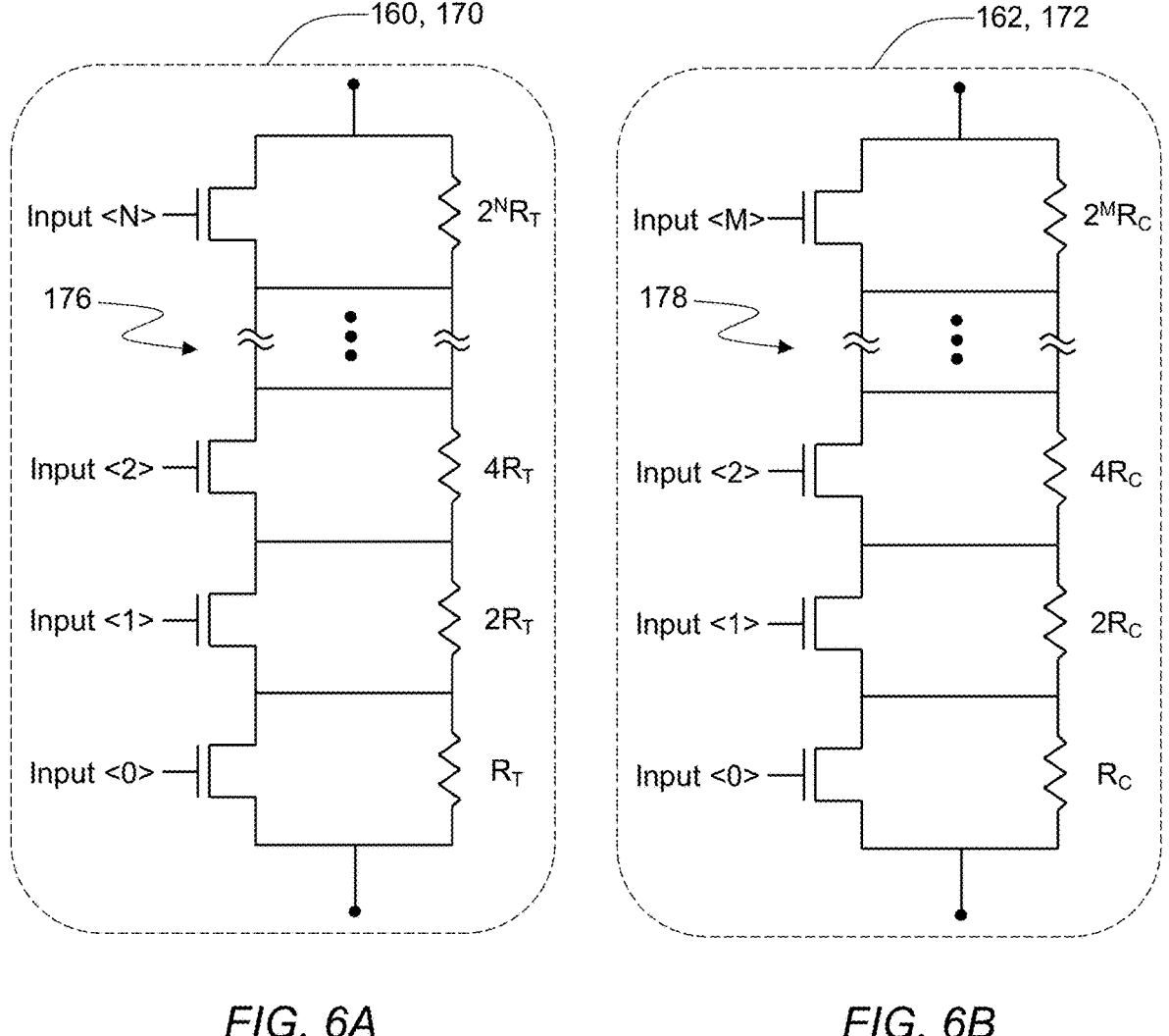
FIG. 6A                    FIG. 6B

400

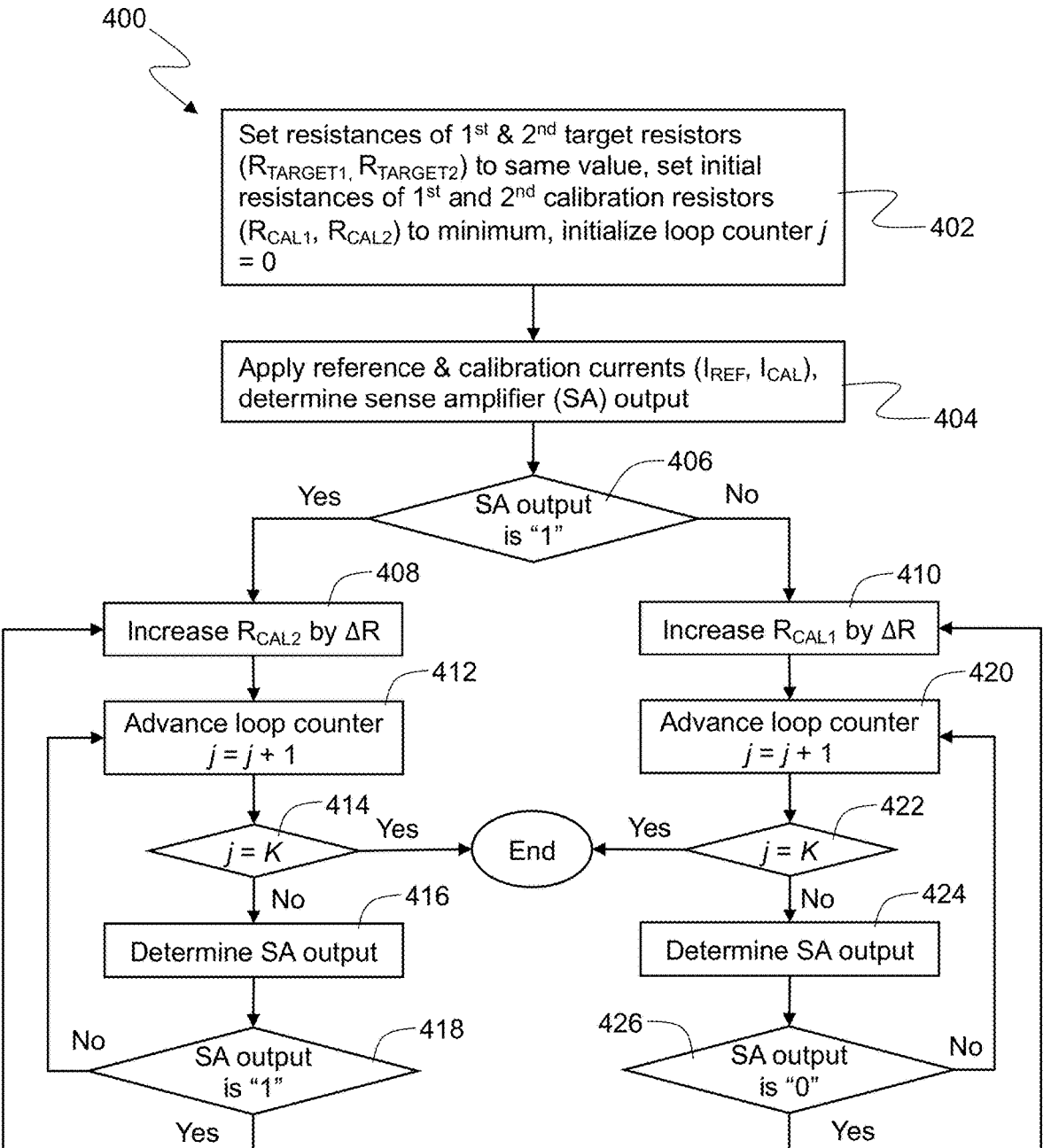

Set resistances of 1ˢᵗ & 2ⁿᵈ target resistors ($R_{TARGET1}$, $R_{TARGET2}$) to same value, set initial resistances of 1ˢᵗ and 2ⁿᵈ calibration resistors ($R_{CAL1}$, $R_{CAL2}$) to minimum, initialize loop counter $j$ = 0 —402

Apply reference & calibration currents ($I_{REF}$, $I_{CAL}$), determine sense amplifier (SA) output —404

SA output is "1" 406

Yes    No

Increase $R_{CAL2}$ by ΔR 408    Increase $R_{CAL1}$ by ΔR 410

Advance loop counter $j = j + 1$ 412    Advance loop counter $j = j + 1$ 420

$j = K$ 414    Yes    End    Yes    $j = K$ 422

No    No

Determine SA output 416    Determine SA output 424

SA output is "1" 418    SA output is "0" 426

No    No

Yes    Yes

*FIG. 7*

MAGNETIC MEMORY DEVICE AND METHOD FOR USING THE SAME

BACKGROUND OF THE INVENTION

The present invention relates to a nonvolatile memory device, and more particularly, to a magnetic memory device and a method for using the same.

A resistance-switching memory device normally comprises an array of memory cells, each of which includes a memory element and a selection element, such as access transistor, coupled in series between two electrodes. The selection element functions like a switch to direct current or voltage through the selected memory element coupled thereto. Upon application of an appropriate voltage or current to the selected memory element, the resistance of the memory element would change accordingly, thereby switching the stored logic in the respective memory cell.

FIG. 1 is a schematic circuit diagram for a conventional memory array 20, which comprises a plurality of memory cells 22 arranged in rows and columns with each of the memory cells 22 including an access transistor 24 coupled to a resistance-switching memory element 26; a plurality of parallel word lines 28 with each being coupled to the gates of a respective row of the access transistors 24 in a first direction; a plurality of parallel bit lines 30 with each being coupled to a respective column of the memory elements 26 in a second direction substantially perpendicular to the first direction; and a plurality of parallel source lines 32 with each being coupled to a respective row or column of the access transistors 24 in the first or second direction.

The resistance-switching memory element 26 may be classified into at least one of several known groups based on their resistance-switching mechanisms. The memory element of Phase Change Random Access Memory (PCRAM) may comprise a phase change chalcogenide compound, which can switch between a resistive phase (amorphous or crystalline) and a conductive crystalline phase. The memory element of Conductive Bridging Random Access Memory (CBRAM) relies on the statistical bridging of metal-rich precipitates therein for its switching mechanism. The memory element of CBRAM normally comprises a nominally insulating metal oxide material, which can switch to a lower electrical resistance state as the metal rich precipitates grow and link to form conductive paths or filaments upon application of an appropriate voltage.

The memory element of Magnetic Random Access Memory (MRAM) normally includes a magnetic reference layer and a magnetic free layer with an electron tunnel junction layer interposed therebetween. The magnetic reference layer, the electron tunnel junction layer, and the magnetic free layer collectively form a magnetic tunnel junction (MTJ). Upon the application of an appropriate current to the MTJ, the magnetization direction of the magnetic free layer can be switched between two configurations: parallel (i.e., same direction) and antiparallel (i.e., opposite direction) with respect to the magnetization direction of the magnetic reference layer. The electron tunnel junction layer is normally made of an insulating material with a thickness ranging from a few to a few tens of angstroms. When the magnetization directions of the magnetic free and reference layers are substantially parallel or oriented in a same direction, electrons polarized by the magnetic reference layer can tunnel through the insulating tunnel junction layer, thereby decreasing the electrical resistance of the MTJ. Conversely, the electrical resistance of the MTJ is high when the magnetization directions of the magnetic reference and free layers are substantially antiparallel or oriented in opposite directions. The stored logic in the magnetic memory element can be switched by changing the magnetization direction of the magnetic free layer between parallel and antiparallel configurations with respect to the magnetization direction of the reference layer. Therefore, the two stable resistance states enable the MTJ to serve as a nonvolatile memory element.

MRAM devices have almost unlimited read/write endurance but relatively smaller sensing margin compared with other types of resistance-switching memory devices, such as phase change random access memory (PCRAM) and resistive random access memory (ReRAM). The resistance ratio of high-to-low resistance state of MRAM is about 2-3, compared with $10^2$-$10^5$ for PCRAM and ReRAM.

FIG. 2 is a plot showing the resistance distributions 40 and 42 respectively corresponding to the low and high resistance states of an MTJ population. The x-axis represents the electrical resistance while the y-axis represents the number of MTJs having a particular electrical resistance. An MTJ having a resistance that falls within the $R_L$ distribution 40 is considered to be in the low resistance ($R_L$) state. Likewise, an MTJ having a resistance that falls within the $R_H$ distribution 42 is considered to be in the high resistance ($R_H$) state. The resistance state of the MTJ may be determined during a read operation by comparing the resistance of the MTJ with a reference resistance that is somewhere in between the $R_L$ distribution 40 and the $R_H$ distribution 42. One way to establish the reference resistance is to simply take the average of the mean of $R_L$ distribution and the mean of $R_H$ distribution as shown in the plot. While being relatively simple, this method results in reduced sensing margin for the high resistance state because of the inherently broader distribution thereof. Another way to select the reference resistance is to choose the midpoint in the gap between the $R_L$ and $R_H$ distributions 40 and 42 (e.g., the average of $R_L$ mean+$3\sigma$ and $R_H$ mean−$3\sigma$) as shown. Compared with the former method, the latter method improves the sensing margin for the high resistance state at room temperature but suffers the same problem at elevated temperatures as the resistance of MTJ decreases.

In addition to above-mentioned challenges, it is critical to minimize or eliminate any bias in the read circuit, since the sensing margin for MRAM devices is relatively small. Potential mismatch at the input terminals of the sense amplifier, which may be caused by differences between the read and reference current paths and/or deviations from design specifications caused by manufacturing, can cause a bias in the read process, thereby significantly degrading the performance of MRAM devices.

For the foregoing reasons, there is a need for a circuit and a method for improving the read performance of MRAM.

SUMMARY OF THE INVENTION

The present invention is directed to a method and a circuit that satisfy this need. A method having features of the present invention for operating a magnetic memory device comprises the steps of providing a read circuit electrically connected to an array of cells, the read circuit including a sense amplifier having first and second input terminals; setting resistances of first and second target resistors in the read circuit to a same value; setting resistances of first and second calibration resistors in the read circuit to a same minimum value; flowing a reference current through the first target resistor, the first calibration resistor, the first input terminal, and a first current source in series; flowing a calibration current through the second target resistor, the second calibration resistor, the second input terminal, and a second current source in series; determining a potential difference between the first and second input terminals; and if the second input terminal has a higher potential than the first input terminal, incrementally increasing the resistance of the second calibration resistor until the first input terminal has a higher potential than the second input terminal, or else if the first input terminal has a higher potential than the second input terminal, incrementally increasing the resistance of the first calibration resistor until the second input terminal has a higher potential than the first input terminal. The method may further comprise the steps of after incrementally increasing the resistance of the first or second calibration resistor, reading a sample population of magnetic memory cells having substantially equal numbers of magnetic memory cells in low and high resistance states; and adjusting the resistance of the first target resistor until an output of the sense amplifier shows that the sample population of magnetic memory cells having substantially equal numbers of magnetic memory cells in the low and high resistance states.

According to another aspect of the present invention, a method for operating a magnetic memory device comprises the steps of providing a read circuit electrically connected to an array of cells, the read circuit including a sense amplifier having first and second input terminals; receiving a read command for sensing a resistance state of a magnetic memory cell in the array of cells; setting resistances of first and second target resistors in the read circuit to a same value; setting resistances of first and second calibration resistors in the read circuit to a same minimum value; flowing a reference current through the first target resistor, the first calibration resistor, the first input terminal, and a first current source in series; flowing a calibration current through the second target resistor, the second calibration resistor, the second input terminal, and a second current source in series; determining a potential difference between the first and second input terminals by the sense amplifier; if the second input terminal has a higher potential than the first input terminal, incrementally increasing the resistance of the second calibration resistor until the first input terminal has a higher potential than the second input terminal, or else if the first input terminal has a higher potential than the second input terminal, incrementally increasing the resistance of the first calibration resistor until the second input terminal has a higher potential than the first input terminal; flowing a read current through the magnetic memory cell, the second calibration resistor, the second input terminal, and the second current source in series; and sensing the resistance state of the magnetic memory cell by determining another potential difference between the first and second input terminals.

According to another aspect of the present invention, a magnetic memory device comprises an array of cells and a read circuit electrically connected thereto, the read circuit comprising a first input node through which a reference current passes; a second input node through which a calibration current or a read current passes; a sense amplifier having first and second input terminals; a first target resistor and a first calibration resistor electrically connected in series between the first input node and the first input terminal of the sense amplifier; a first current source electrically connected to the first input terminal of the sense amplifier at one end and ground at the other end; a multiplexer having a first input terminal electrically connected to the second input node and having a substantially same potential as the input node, a second input terminal, and an output terminal; a second target resistor electrically connected to the second input node at one end and the second input terminal of the multiplexer at the other end; a second calibration resistor electrically connected to the output terminal of the multiplexer at one end and the second input terminal of the sense amplifier at the other end; and a second current source electrically connected to the second calibration resistor at one end and ground at the other end.

BRIEF DESCRIPTION OF DRAWINGS

These and other features, aspects, and advantages of the present invention will become better understood with regard to the following description, appended claims, and accompanying drawings where:

FIG. 6A is a schematic circuit diagram for an exemplary variable resistance circuit used for first and second target resistors of the read circuit shown in FIG. 5;

FIG. 6B is a schematic circuit diagram for an exemplary variable resistance circuit used for first and second calibration resistors of the read circuit shown in FIG. 5;

FIG. 7 is a flow diagram illustrating selected steps of an exemplary process for correcting offset at input terminals of a sense amplifier of the read circuit shown in FIG. 5;

For purposes of clarity and brevity, like elements and components will bear the same designations and numbering throughout the Figures, which are not necessarily drawn to scale.

DETAILED DESCRIPTION OF THE INVENTION

In the Summary above and in the Detailed Description, and the claims below, and in the accompanying drawings, reference is made to particular features (including method steps) of the invention. It is to be understood that the disclosure of the invention in this specification includes all possible combinations of such particular features. For example, where a particular feature is disclosed in the context of a particular aspect or embodiment of the invention, or a particular claim, that feature can also be used, to the extent possible, in combination with and/or in the context of other particular aspects and embodiments of the invention, and in the invention generally.

Where reference is made herein to a method comprising two or more defined steps, the defined steps can be carried out in any order or simultaneously, except where the context excludes that possibility, and the method can include one or more other steps which are carried out before any of the defined steps, between two of the defined steps, or after all the defined steps, except where the context excludes that possibility.

The term "at least" followed by a number is used herein to denote the start of a range beginning with that number, which may be a range having an upper limit or no upper limit, depending on the variable being defined. For example, "at least 1" means 1 or more than 1. The term "at most" followed by a number is used herein to denote the end of a range ending with that number, which may be a range having 1 or 0 as its lower limit, or a range having no lower limit, depending upon the variable being defined. For example, "at most 4" means 4 or less than 4, and "at most 40%" means 40% or less than 40%. When, in this specification, a range is given as "a first number to a second number" or "a first number-a second number," this means a range whose lower limit is the first number and whose upper limit is the second number. For example, "25 to 100 nm" means a range whose lower limit is 25 nm and whose upper limit is 100 nm.

Directional terms, such as "front," "back," "top," "bottom," and the like, may be used with reference to the orientation of the illustrated figure. Spatially relative terms, such as "beneath," "below," "under," "lower," "upper," "above," etc., may be used herein to describe one element's relationship to another element(s) as illustrated in the figure. Since articles and elements can be positioned in a number of different orientations, these terms are intended for illustration purposes and in no way limit the invention, except where the context excludes that possibility.

Where reference is made herein to a material AB composed of element A and element B, the material AB can be an alloy, a compound, or a combination thereof, except where the context excludes that possibility.

Figure 3:
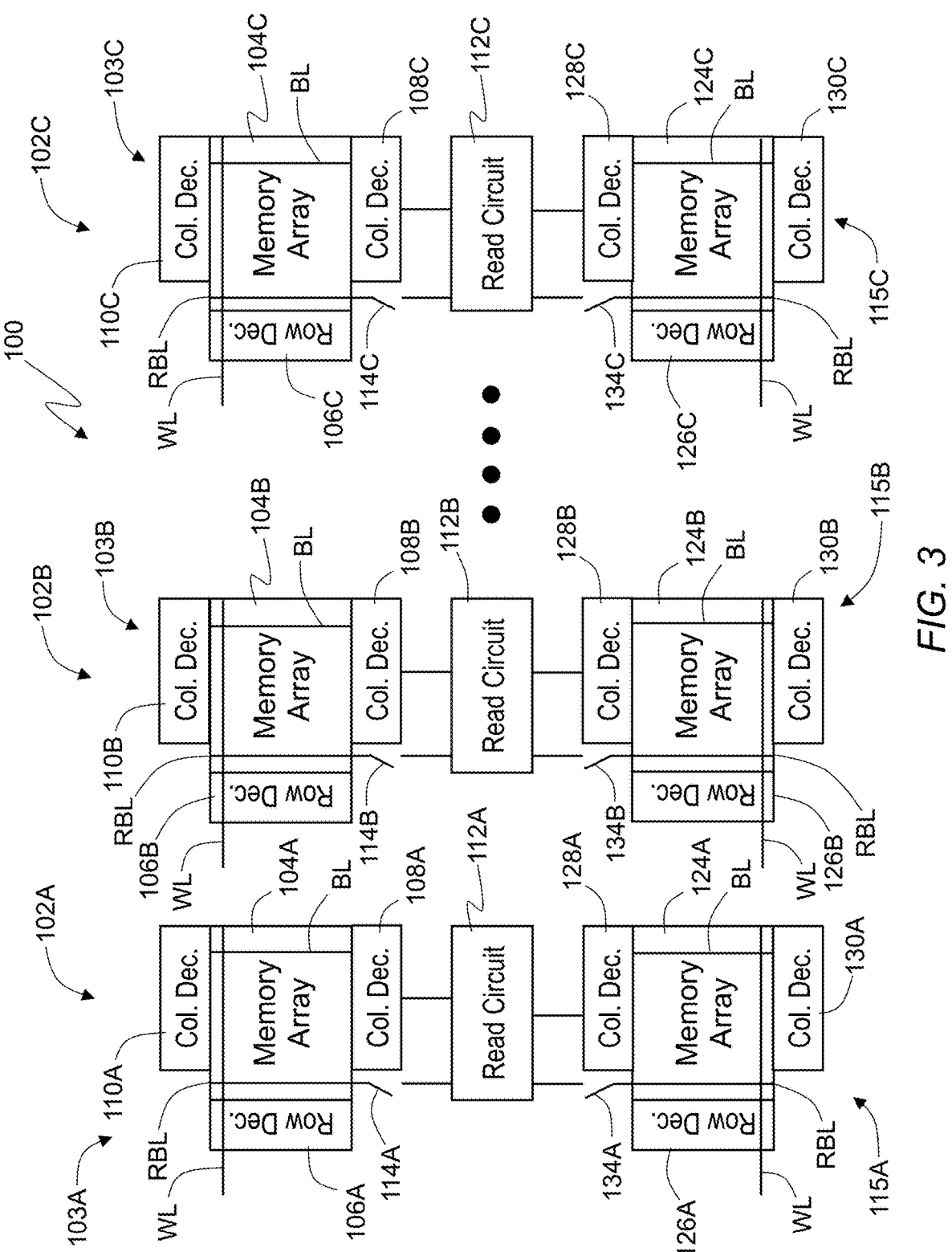
FIG. 3 is a block diagram illustrating components of a memory device in accordance with an exemplary embodiment of the present invention.

FIG. 3 is a block diagram illustrating components of a memory device 100 in accordance with an exemplary embodiment of the present invention. The memory device 100 includes a plurality of I/O or memory slices represented by memory slices 102A-102C. Each of the I/O or memory slices 102A-102C has independent input/output from other slices and may include one or two memory sectors. Each memory slice (e.g., 102A) may include a first memory sector (e.g., 103A) and a read circuit (e.g., 112A) connected thereto. The first memory sector 103A includes a first memory array 104A, a first row decoder 106A for selecting one of word lines (WLs) traversing the first memory array 104A along a first direction, a first column decoder 108A for selecting a bit line (BL) traversing the first memory array 104A along a second direction substantially perpendicular to the first direction, and a second column decoder 110A for selecting a source line (not shown) traversing the memory array 104A along the second direction. The read circuit 112A is electrically connected to the output of the first column decoder 108A.

Figure 1:
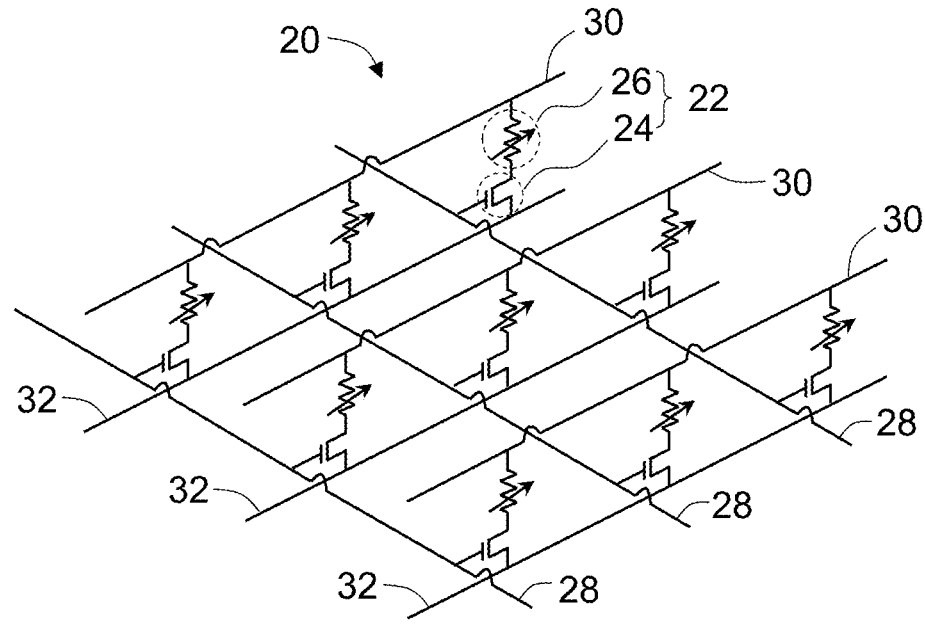
FIG. 1 is a schematic circuit diagram for an array of memory cells with each memory cell including a resistance-switching memory element and an access transistor coupled in series between a bit line and a source line.

The first memory array 104A is analogous to the memory array 20 shown in FIG. 1 and includes a plurality of memory cells arranged in rows and columns (not shown), a plurality of parallel word lines (WLs), a plurality of parallel bit lines (BLs), and a plurality of parallel source lines (not shown). The first memory array 104A may also include a reference bit line (RBL) electrically connected to the read circuit 112A through a first switch 114A. The reference bit line (RBL) may provide a reference signal or current to the read circuit 112A when determining the resistance state of a memory cell in the memory array 104A.

Each memory slice (e.g., 102A) may further include a second memory sector (e.g., 115A) electrically connected to the read circuit (e.g., 112A). The second memory sector 115A includes a second memory array 124A, a second row decoder 126A for selecting a word line (WL) traversing the second memory array 124A along the first direction, a third column decoder 128A for selecting a bit line (BL) traversing the second memory array 124A along the second direction substantially perpendicular to the first direction, and a fourth column decoder 130A for selecting a source line (not shown) traversing the memory array 124A along the second direction. The second memory array 124A may also include a reference bit line (RBL) electrically connected to the read circuit 112A through a second switch 134A. The first and second memory sectors 103A and 115A may be physically arranged in a mirror-image geometry on opposite sides of the read circuit 112A that acts as the mirror line.

Figure 4:
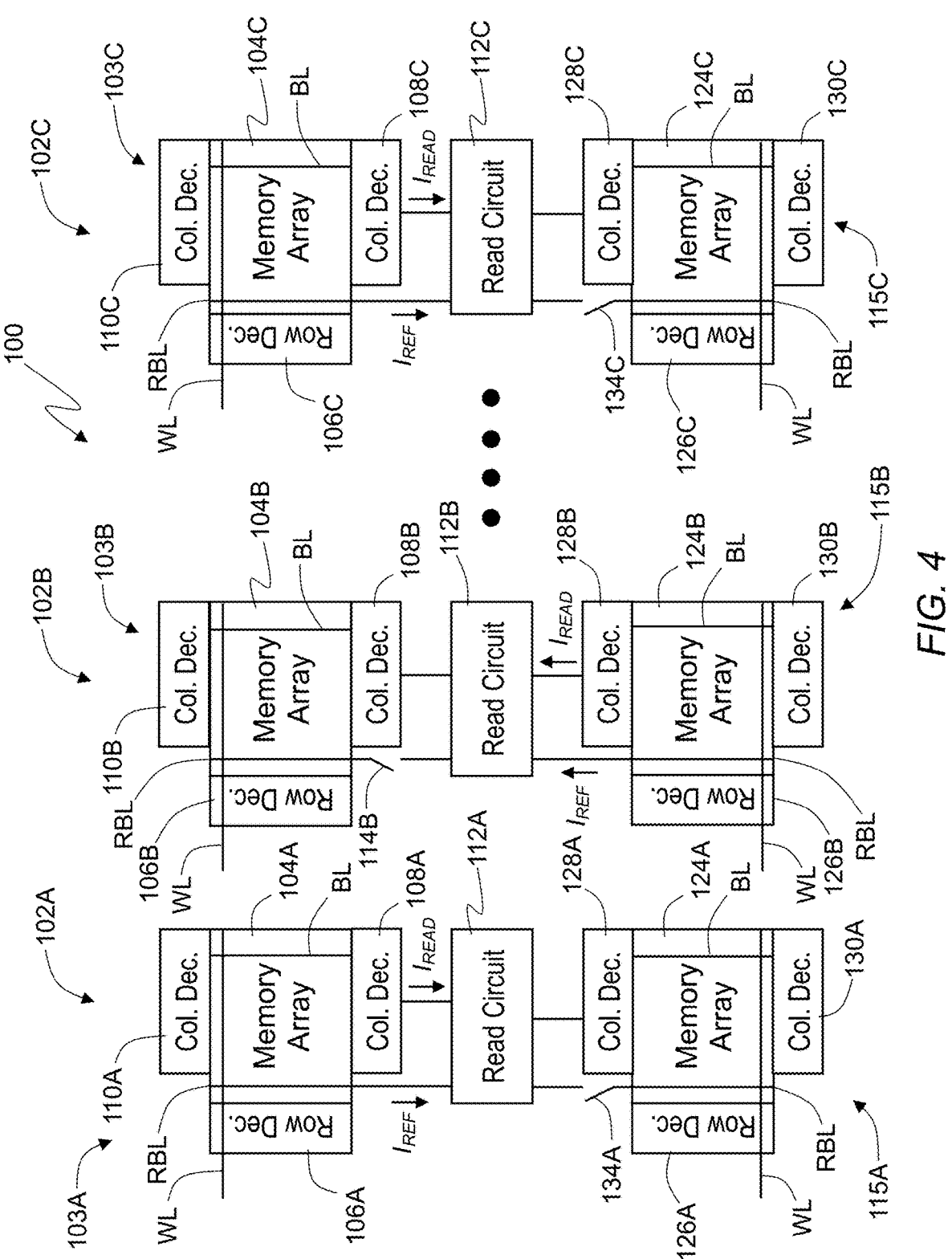
FIG. 4 is a diagram illustrating an example of read and reference current paths for the memory device of FIG. 3 in a read operation.

Since each of the memory slices 102A-102C includes a respective one of the read circuits 112A-112C, a memory cell from each of the memory slices 102A-102C may be independently sensed at the same time. For example and without limitation, FIG. 4 shows that a memory cell from the first memory sector 103A of the first memory slice 102A, another memory cell from the second memory sector 115B of the second memory slice 102B, and still another memory cell from the first memory sector 103C of the last memory slice 102C are simultaneously sensed. During the sensing or read operation, the read current, $I_{READ}$, passes through the memory cell selected for the read operation, the bit line electrically connected thereto, and reaches the read circuit via the first or third column decoder, while the reference current ($I_{REF}$) passes through the reference bit line (RBL) to reach the read circuit via the first or second switch.

Figure 5:
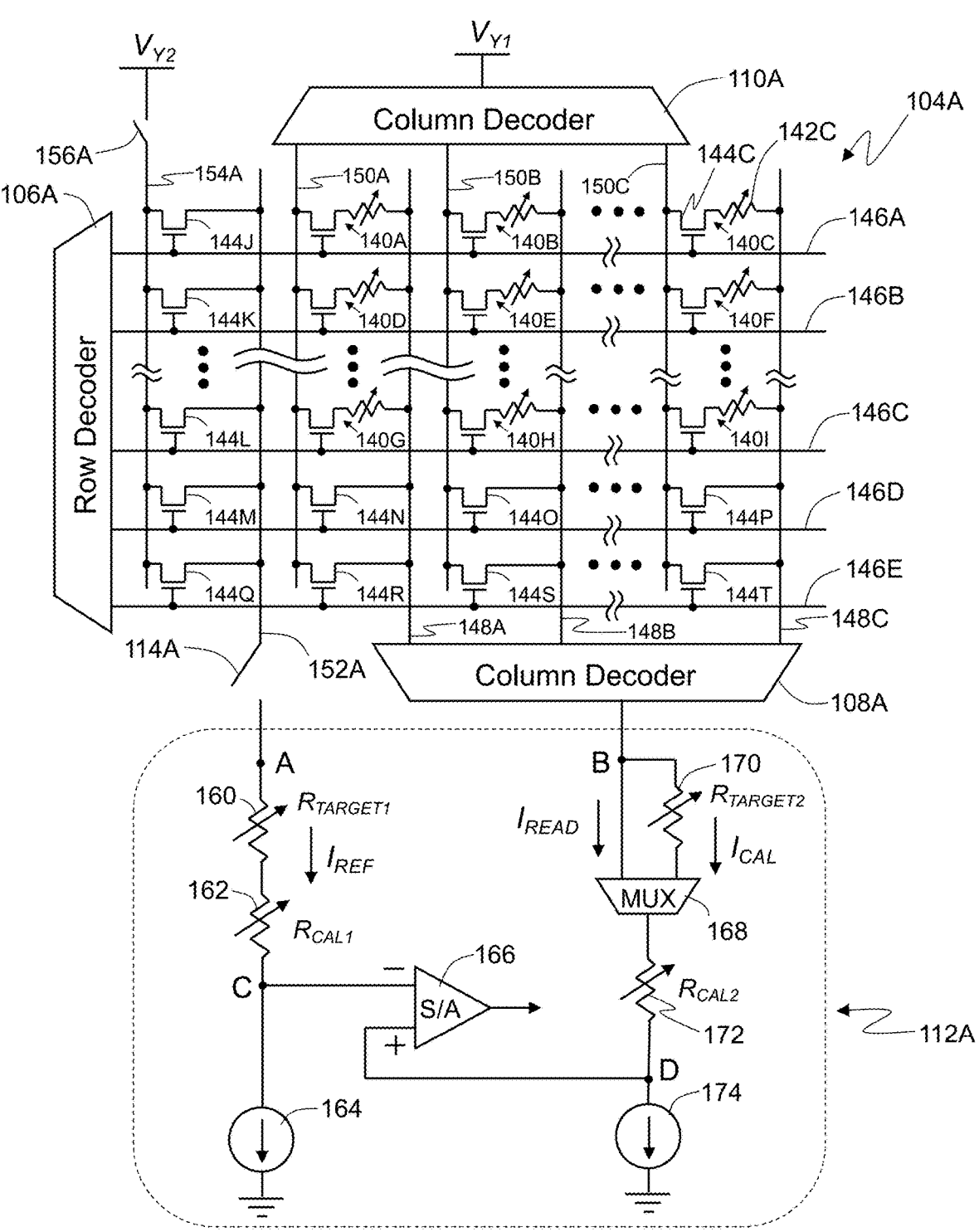
FIG. 5 is a schematic circuit diagram for a memory sector and a read circuit of the memory device of FIG. 3.

FIG. 5 is schematic circuit diagram showing the first memory sector 103A and the read circuit 112A of the first memory slice 102A. The first memory sector 103A includes the first memory array 104A, the first row decoder 106A, the first and second column decoders 108A and 110A, and the first switch 114A. The first memory array 104A includes a plurality of memory cells arranged in rows and columns as represented by cells 140A-140I, a plurality of word lines represented by lines 146A-146C, a plurality of bit lines represented by lines 148A-148C, and a plurality of source lines represented by lines 150A-150C. Each memory cell (e.g., 140C) includes a resistance-switching memory element (e.g., 142C) and an access transistor (e.g., 144C) coupled in series between a respective one of the bit lines (e.g., 148C) and a respective one of the source lines (e.g., 150C). Each of the plurality of word lines 146A-146C is coupled to the gates of a respective row of the access transistors in a first direction. Each of the plurality of bit lines 148A-148C is coupled to a respective column of the memory cells 140A-140I at one end thereof (e.g., memory element) along a second direction. Each of the plurality of source lines 150A-150C is coupled to a respective column of the memory cells 140A-140I at the other end thereof (e.g., access transistor) along the second direction. The first and second directions may be substantially orthogonal to each other. The positions of the resistance-switching memory element (e.g., 142C) and the access transistor (e.g., 144C) in a memory cell (e.g., 140C) may be swapped such that the memory element (e.g., 142C) and the access transistor (e.g., 144C) are disposed adjacent to the source line (e.g., 150C) and the bit line (e.g., 148C), respectively.

Each of the resistance-switching memory elements (e.g., 142C) may change the resistance state thereof by any suitable switching mechanism, such as but not limited to phase change, precipitate bridging, magnetoresistive switching, or any combination thereof. In one embodiment, the memory element 142C comprises a phase change chalcogenide compound, such as but not limited to $Ge_2Sb_2Te_5$ or AgInSbTe, which can switch between a resistive phase and a conductive phase. In another embodiment, the memory element 142C comprises a nominally insulating metal oxide material, such as but not limited to NiO, $TiO_2$, or Sr(Zr) $TiO_3$, which can switch to a lower electrical resistance state as metal rich precipitates grow and link to form conductive paths upon application of an appropriate voltage. In still another embodiment, the memory element 142C comprises a magnetic free layer, a magnetic reference layer, and an insulating electron tunnel junction layer interposed therebetween, which collectively form a magnetic tunnel junction (MTJ). When a switching current is directly applied to the MTJ, the magnetic free layer would switch the magnetization direction thereof, thereby changing the electrical resistance of the MTJ. The magnetic free layer may have a variable magnetization direction substantially perpendicular to a layer plane thereof. The magnetic reference layer may have a fixed magnetization direction substantially perpendicular to a layer plane thereof. Alternatively, the magnetization directions of the magnetic free and reference layers may be oriented parallel to the respective layer planes.

The first memory array 104A further includes a column of access transistors 144J-144L with the gate of each access transistor coupled to a respective one of the word lines 146A-146C. The column of access transistors 144J-144L, which are used to control the reference current during the read operation, can be regarded as "dummy" cells without memory elements. The column of access transistors 144J-144L are coupled to a reference bit line (RBL) 152A at one of the source and drain and to a reference source line 154A at the other one of the source and drain. The first memory array 104A may further include one or more rows of access transistors 144M-144T ("dummy cells") electrically connected to one or more word lines 146D and 146E ("dummy word lines") at the gates thereof. Each transistor of the rows of the access transistors 144M-144T is electrically connected to a respective one of the bit lines 148A-148C or the reference bit line 152A at one of the source and drain and to a respective one of the source lines 150A-150C or the reference source line 154A at the other one of the source and drain. It may not be necessary to have the one or more rows of the access transistors 144M-144T in all memory sectors connected to the read circuit 112A since these dummy cells are used to allow a calibration current to bypass the memory cells 140A-140I when calibrating the read circuit 112A as will be described in more detail below.

All of the word lines 146A-146E may be electrically connected to the row decoder 106A, which allows one the word line 146A-146E to be selected for read or write operation. A voltage ($V_{Y1}$) may be applied to one of the source lines 150A-150C via the second column decoder 110A electrically connected thereto during the read or write operation. Similarly, another voltage (e.g., $V_{Y2}$) may be applied to the reference source line 154A through a third switch 156A. In an embodiment, the voltages $V_{Y1}$ and $V_{Y2}$ are set to the same voltage ($V_{READ}$) during the read operation and the calibration of the read circuit 112A. The first column decoder 108A electrically connected to the bit lines 148A-148C allows one of the bit lines 148A-148C to be electrically connected to Node B of the read circuit 112A. Likewise, the reference bit line 152A may be electrically connected to Node A of the read circuit 112A via the first switch 114A.

The read circuit 112A includes two input terminals at Nodes A and B, a first target resistor ($R_{TARGET1}$) 160 and a first calibration resistor ($R_{CAL1}$) 162 electrically connected in series between Nodes A and C, a first current source 164 electrically connected to Node C at one end and ground at the other end, a multiplexer (MUX) 168 with one of the two inputs electrically connected to Node B, a second target resistor ($R_{TARGET2}$) 170 electrically connected to Node B and at one end and the other one of the two inputs of the multiplexer (MUX) 168 at the other end, a second calibration resistor ($R_{CAL2}$) 172 electrically connected to the output of the multiplexer (MUX) 168 at one end and Node D at the other end, a second current source 174 electrically connected to Node D at one end and ground at the other end, and a sense amplifier 166 with one input (e.g., negative input terminal) electrically connected to Node C and the other input (e.g., positive input terminal) electrically connected to Node D. The first and second target resistors 160 and 170 are variable resistors that may have the same design specifications. However, the actual resistances of the resistors 160 and 170 may be different owing to manufacturing variation. Similarly, the first and second calibration resistors 162 and 172 are variable resistors that may have the same design specifications. However, the actual resistances of the resistors 162 and 172 may be different owing to manufacturing variation.

FIG. 6A is a schematic circuit diagram for the first and second target resistors ($R_{TARGET1}$, $R_{TARGET2}$) 160, 170 in accordance with an embodiment of the present invention. The target resistors ($R_{TARGET1}$, $R_{TARGET2}$) 160 and 170 may each include a variable resistance circuit 176 that comprises N+1 number of sub-circuits electrically connected in series. Each sub-circuit includes a transistor and a resistor with fixed resistance electrically connected in parallel. The resistance of the resistor in the sub-circuit doubles in the successive sub-circuit in the sequence the sub-circuits, such that the last sub-circuit in the series includes a resistor having a resistance of $2^N R_T$, where $R_T$ represents the resistance of the resistor in the first sub-circuit of the sequence of sub-circuits and the minimum incremental adjustment in the resistance of the variable resistance circuit 176. The resistances of the first and second target resistors ($R_{TARGET1}$, $R_{TARGET2}$) 160, 170 may be independently adjusted by N+1 input values or signals (i.e., Input <0> to Input <N>) to the transistors of the respective sub-circuits, which collectively provide a nominal resistance range of 0 to $(2^{N+1}-1)R_T$. The nominal resistances of the target resistors ($R_{TARGET1}$, $R_{TARGET2}$) 160 and 170 become 0 and $(2^{N+1}-1)R_T$ when all input values or signals (i.e., Input <0> to Input <N>) are set to "1" and "0", respectively.

FIG. 6B is a schematic circuit diagram for the first and second calibration resistors ($R_{CAL1}$, $R_{CAL2}$) 162 and 172 in accordance with another embodiment of the present invention. The calibration resistors ($R_{CAL1}$, $R_{CAL2}$) 162 and 172 may each include a variable resistance circuit 178 that comprises M+1 number of sub-circuits electrically connected in series. Each sub-circuit includes a transistor and a resistor with fixed resistance electrically connected in parallel. The resistance of the resistor in the sub-circuit doubles in the successive sub-circuit in the sequence the sub-circuits, such that the last sub-circuit in the series includes a resistor having a resistance of $2^M R_C$, where $R_C$ represents the resistance of the resistor in the first sub-circuit of the sequence of sub-circuits and the minimum incremental adjustment in the resistance of the variable resistance circuit 178. The resistances of the first and second calibration resistors ($R_{CAL1}$, $R_{CAL2}$) 162, 172 may be independently adjusted by M+1 input values or signals (i.e., Input <0> to Input <M>) to the transistors of the respective sub-circuits, which collectively provide a nominal resistance range of 0 to $(2^{M+1}-1)R_C$. The nominal resistances of the calibration resistors ($R_{CAL1}$, $R_{CAL2}$) 162 and 172 become 0 and $(2^{M+1}-1)R_C$ when all input values or signals (i.e., Input <0> to Input <M>) are set to "1" and "0", respectively.

Referring back to FIG. 5, during calibration of the read circuit 112A, one of the dummy word lines (e.g., 146D) electrically connected to the row of transistors 144M-144P, which may function as dummy cells without memory elements, may be selected via the row decoder 106A to allow the reference current ($I_{REF}$) to flow from the reference source line 154A with the voltage $V_{READ}$ (i.e., $V_{Y2}=V_{READ}$) applied thereto, through the access transistor 144M, the reference bit line 152A, and the first switch 114A, to the input terminal Node A of the read circuit 112A. From Node A, the reference current ($I_{REF}$) passes through the first target resistor ($R_{TARGET1}$) 160, the first calibration resistor ($R_{CAL1}$) 162, and the first current source 164, and to ground.

The selection of the word line 146D during calibration also enables the calibration current ($I_{CAL}$) to flow from one of the source lines 150A-150C (e.g., 150C) selected through the second column decoder 110A and having the applied voltage of $V_{READ}$ (i.e., $V_{Y1}=V_{READ}$), through a respective one of the access transistors 144N-144P (e.g., 144P), a respective one of the bit lines 148A-148C (e.g., 148C), and the first column decoder 108A, to the input terminal Node B of the read circuit 112A. From Node B, the calibration current ($I_{CAL}$) flows through the second target resistor ($R_{TARGET2}$) 170, the multiplexer (MUX) 168, the second calibration resistor ($R_{CAL2}$) 172, the second current source 174, and to ground. During the calibration process, the sense amplifier 166 measures the voltage differential at Nodes C and D at the reference current path and the calibration current path, respectively. Neither the reference current ($I_{REF}$) nor the calibration current ($I_{CAL}$) passes through any of the memory cells 140A-140I containing the memory elements.

During the read operation, a memory cell (e.g., 140C) is selected for reading or sensing by selecting the word line (e.g., 146A) electrically connected thereto. The source line 150C electrically connected to the selected memory cell 140C is selected by the second column decoder 110A and may have a potential of $V_{READ}$ (i.e., $V_{Y1}=V_{READ}$). The bit line 148C electrically connected to the selected memory cell 140C is selected by the first column decoder 108A, thereby allowing the read current ($I_{READ}$) to flow from the source line 150C, through the access transistor 144C, the memory element 142C, the bit line 148C, and the first column decoder 108A, to Node B of the read circuit 112A. From Node B, the read current ($I_{READ}$) passes the multiplexer (MUX) 168, the second calibration resistor ($R_{CAL2}$) 172, the second current source 174, and to ground, bypassing the second target resistor ($R_{TARGET2}$) 170. The multiplexer (MUX) 168 is used to select different current paths during the read and calibration operations.

The selection of the word line 146A during the read operation and activation of the first and third switches 114A and 156A allow the reference current ($I_{REF}$) to flow from the reference source line 154A, which may have a potential of $V_{READ}$ applied thereto, through the access transistor 144J, the reference bit line 152A, and the first switch 114A, to Node A of the read circuit 112A. From Node A, the reference current ($I_{REF}$) passes through the first target resistor ($R_{TARGET1}$) 160, the first calibration resistor ($R_{CAL1}$) 162, the first current source 164, and to ground.

During the read process, the sense amplifier 166 measures the voltage differential between Nodes C and D located at the reference current path and the read current path, respectively. The first target resistor ($R_{TARGET1}$) 160 may function as the reference resistor, whose resistance is ideally somewhere in between the low and high resistances of the memory element 142C. In an ideal situation where the read circuit 112A has no mismatch at the input terminals of the sense amplifier 166, when the memory element 142C is in the low resistance state, the voltage drop across the memory element 142C may be less than the voltage drop across the first target resistor ($R_{TARGET1}$) 160, resulting in the voltage of Node D being higher than that of Node C. Conversely, the voltage drop across the memory element 142C may be greater than the voltage drop across the first target resistor ($R_{TARGET1}$) 160 when the memory element 142C is in the high resistance state, resulting in the voltage of Node D being lower than that of Node C.

Figure 2:
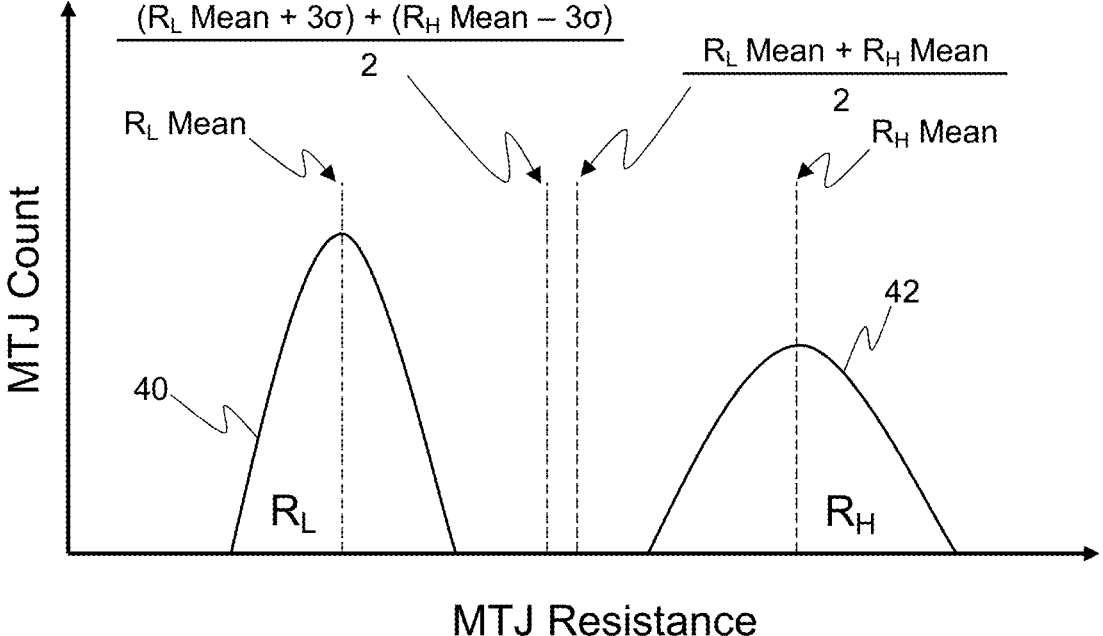
FIG. 2 is a plot showing low and high resistance distributions for a sample population of magnetic tunnel junctions (MTJs)

Knowing the low and high resistance distributions 40 and 42 corresponding to the memory elements of the memory array 104A as shown in FIG. 2, the resistance of the first target resistor ($R_{TARGET1}$) 160 may be simply set to a value somewhere in between the $R_L$ distribution 40 and the $R_H$ distribution 42 in an ideal situation. However, the potential mismatch of the sense amplifier 166 and/or the current sources 164 and 174 at the input terminals (i.e., Nodes C and D), which may be caused by manufacturing variations, can cause a bias in the sensing process. Accordingly, the read circuit 112A may be calibrated prior to sensing or reading process to correct any potential sensing bias caused by the above cited factors. During this calibration process, the resistances of the target resistors 160 and 170 are fixed at the same value, while the first and/or second calibration resistor (162, 172) is varied to minimize any bias or offset at the input terminals of the sense amplifier 166 (i.e., Nodes C and D) and the sense amplifier 166 itself.

FIG. 7 is a flow diagram describing selected steps 400 for correcting the offset at the input terminals of the sense amplifier 166. The process begins at step 402 by setting the resistances of the first and second target resistors ($R_{TARGET1}$, $R_{TARGET2}$) 160 and 170 to a same value, setting the initial resistances of the first and second calibration resistors ($R_{CAL1}$, $R_{CAL2}$) 162 and 172 to their minimum values (i.e., all inputs to the variable resistance circuit 178 of FIG. 6B are set to "1"), and initializing the loop counter j to zero. For example, the resistances of the first and second target resistors ($R_{TARGET1}$, $R_{TARGET2}$) 160 and 170 may be set to approximately half of their maximum value by setting Input <N> of the variable resistance circuit 176 (FIG. 6A) to "0" and other inputs to "1" or by setting Input <N> to "1" and other inputs to "0." Alternatively, the resistances of the first and second target resistors ($R_{TARGET1}$, $R_{TARGET2}$) 160 and 170 may be set to their minimum value or maximum value by setting all inputs to "1" or "0," respectively. The initial resistances of the first and second calibration resistors ($R_{CAL1}$, $R_{CAL2}$) 162 and 172 may alternatively be set to their maximum values (i.e., all inputs are "0"). By setting the initial resistances of the first and second calibration resistors ($R_{CAL1}$, $R_{CAL2}$) 162 and 172 to either their minimum or maximum value, only one of the calibration resistors ($R_{CAL1}$, $R_{CAL2}$) 162 and 172 needs to be adjusted in the calibration process. The loop counter j is used to record or count the number of iterations in resistance adjustment for the first or second calibration resistor ($R_{CAL1}$, $R_{CAL2}$) 162 or 172 in the calibration process.

After setting the resistance values of the variable resistors (160, 162, 170, and 172) at step 402, the calibration process for the read circuit 112A continues by applying the reference current ($I_{REF}$) and calibration current ($I_{CAL}$) to the first memory sector 103A and the read circuit 112A shown in FIG. 5, and determining the output of the sense amplifier 166 at step 404. As described above, during the calibration process, one of the dummy word lines (e.g., 146D) electrically connected to a row of dummy cells (e.g., 144M-144P) may be selected via the row decoder 106A to allow the reference current ($I_{REF}$) to flow from the reference source line 154A with the voltage $V_{READ}$ (i.e., $V_{Y2}$=$V_{READ}$) applied thereto, through the access transistor or dummy cell 144M, the reference bit line 152A, the first switch 114A, and to the input terminal Node A of the read circuit 112A. From Node A, the reference current ($I_{REF}$) passes through the first target resistor ($R_{TARGET1}$) 160, the first calibration resistor ($R_{CAL1}$) 162, the first current source 164, and to ground.

The selection of the dummy word line 146D during calibration also enables the calibration current ($I_{CAL}$) to flow from one of the source lines 150A-150C (e.g., 150C) selected through the second column decoder 110A and having the applied voltage of $V_{READ}$ (i.e., $V_{Y1}$=$V_{READ}$), through a respective one of the access transistors or dummy cells 144N-144P (e.g., 144P), a respective one of the bit lines 148A-148C (e.g., 148C), the first column decoder 108A, and to the input terminal Node B of the read circuit 112A. From Node B, the calibration current ($I_{CAL}$) flows through the second target resistor ($R_{TARGET2}$) 170, the multiplexer (MUX) 168, the second calibration resistor ($R_{CAL2}$) 172, the second current source 174, and to ground. During the calibration process while the reference current ($I_{REF}$) and calibration current ($I_{CAL}$) are flowing, the sense amplifier 166 measures the voltage differential at Nodes C and D at the reference current path and the calibration current path, respectively. Neither the reference current ($I_{REF}$) nor the calibration current ($I_{CAL}$) passes through any of the memory cells 140A-140I containing the memory elements.

After step 404, the process continues to step 406, where a decision is made as to whether the output of the sense amplifier 166 is "1." If so, the positive input terminal of the sense amplifier 166 (i.e., Node D) has higher potential than the negative input terminal (i.e., Node C) and the process advances to step 408, where the resistance of the second calibration resistor ($R_{CAL2}$) 172 is incrementally increased to decrease the potential at the positive input terminal. Otherwise (i.e., output being "0"), the negative input terminal of the sense amplifier 166 (i.e., Node C) has higher potential than the positive input terminal (i.e., Node D) and the process advances to step 410, where the resistance of the first calibration resistor ($R_{CAL1}$) 162 is incrementally increased to decrease the potential at the negative input terminal. By setting the initial resistances of the first and second calibration resistors ($R_{CAL1}$, $R_{CAL2}$) 162 and 172 to their minimum value at step 402, only one of the calibration resistors ($R_{CAL1}$, $R_{CAL2}$) 162 and 172 needs to be adjusted after step 406 in the calibration process.

Using the variable resistance circuit 178 shown in FIG. 6B as an example, the second calibration resistor ($R_{CAL2}$) 172 may increase its resistance by decrementing the initial input value "11 . . . 11" of the variable resistance circuit 178 at step 408, where the first and last digits of the input value correspond to Inputs <M> and <0>, respectively. The increasing incremental resistance ($\Delta R$) may correspond to $R_C$ or any multiple of $R_C$. For example, if $\Delta R$ corresponds to $R_C$, then the input value is decremented by 1 and becomes 11 . . . 10; if $\Delta R$ corresponds to $2R_C$, then the input value is decremented by 2 and become 11 . . . 01, and so on. Accordingly, the number of resistance increments required to span the entire resistance range of the variable resistance circuit 178 would be $2^{M+1}-1$, $(2^{M+1}-1)/2$, $(2^{M+1}-1)/3$ for $\Delta R$ of $R_C$, $2R_C$, and $3R_C$, respectively.

After the resistance of the second calibration resistor ($R_{CAL2}$) 172 is incrementally increased by $\Delta R$, the loop counter is advanced by 1 at step 412.

Next, at step 414 another decision is made as to whether the loop counter j has reached a predetermined limit K, which may correspond to the number of resistance increments required to span the entire resistance range of the variable resistance circuit 178. For example, K may correspond to $2^{M+1}-1$ for $\Delta R$=$R_C$. If the number of resistance iterations (i.e., 1) reaches K, the calibration process will reach the end and be terminated. Otherwise, the calibration process continues to step 416, where the output of the sense amplifier 166 is determined. The sense amplifier 166 measures the voltage differential at Nodes C (negative input terminal) and D (positive input terminal) at the reference current path and the calibration current path, respectively.

Next, at step 418 still another decision is made as to whether the output of the sense amplifier 166 is "1." If so, the positive input terminal of the sense amplifier 166 (i.e., Node D) still has higher potential than the negative input terminal (i.e., Node C) and the process loops back to step 408, where the resistance of the second calibration resistor ($R_{CAL2}$) 172 is incrementally increased by $\Delta R$ again to decrease the potential at the positive input terminal. Otherwise (i.e., output being "0"), the negative input terminal of the sense amplifier 166 (i.e., Node C) has higher potential than the positive input terminal (i.e., Node D), which means the voltage offset or bias at Nodes C and D has reversed, and the process advances to step 412 without changing the resistance of the second calibration resistor ($R_{CAL2}$) 172.

Steps 408 and 412-418 are repeated to adjust the resistance of the second calibration resistor ($R_{CAL2}$) 172 until the loop counter j reaches the predetermined limit K. If the output of the sense amplifier 166 flips and becomes "0" (i.e., Node C has higher potential than Node D) at step 418 prior to j reaching K, then the resistance of the second calibration resistor ($R_{CAL2}$) 172 may not further increase during the iteration process because the voltage offset or bias at the input terminals of the sense amplifier 166 has been sufficiently minimized.

If the initial output of the sense amplifier 166 at step 406 is "0," then the resistance of the first calibration resistor ($R_{CAL1}$) 162 is adjusted instead of the resistance of the second calibration resistor ($R_{CAL2}$) 172. The resistance adjustment of the first calibration resistor ($R_{CAL1}$) 162 is analogous to the resistance adjustment of the second calibration resistor ($R_{CAL2}$) 172 described above in steps 408 and 412-418.

At step 410, the first calibration resistor ($R_{CAL1}$) 162 may increase its resistance by decrementing the initial input value "11 . . . 11" of the variable resistance circuit 178, where the first and last digits of the input value correspond to Inputs <M> and <0>, respectively. The increasing incremental resistance ($\Delta R$) may correspond to $R_C$ or any multiple of $R_C$. For example, if $\Delta R$ corresponds to $R_C$, then the input value is decremented by 1 and becomes 11 . . . 10; if $\Delta R$ corresponds to $2R_C$, then the input value is decremented by 2 and become 11 . . . 01, and so on. Accordingly, the number of resistance increments required to span the entire resistance range of the variable resistance circuit 178 would be $2^{M+1}-1$, $(2^{M+1}-1)/2$ $(2^{M+1}-1)/3$ for $\Delta R$ of $R_C$, $2R_C$, and $3R_C$, respectively.

After the resistance of the first calibration resistor ($R_{CAL1}$) 162 is incrementally increased by $\Delta R$, the loop counter is advanced by 1 at step 420.

Next, at step 422 another decision is made as to whether the loop counter j has reached a predetermined limit K, which may correspond to the number of resistance increments required to span the entire resistance range of the variable resistance circuit 178. For example, K may correspond to $2^{M+1}-1$ for $\Delta R=R_C$. If the number of resistance iterations (i.e., 1) reaches K, the calibration process will reach the end and be terminated. Otherwise, the calibration process continues to step 424, where the output of the sense amplifier 166 is determined. The sense amplifier 166 measures the voltage differential at Nodes C (negative input terminal) and D (positive input terminal) at the reference current path and the calibration current path, respectively.

Next, at step 426 still another decision is made as to whether the output of the sense amplifier 166 is "0." If so, the negative input terminal of the sense amplifier 166 (i.e., Node C) still has higher potential than the positive input terminal (i.e., Node D) and the process loops back to step 410, where the resistance of the first calibration resistor ($R_{CAL1}$) 162 is incrementally increased by $\Delta R$ again to decrease the potential at the negative input terminal. Otherwise (i.e., output being "1"), the positive input terminal of the sense amplifier 166 (i.e., Node D) has higher potential than the negative input terminal (i.e., Node C), which means the voltage offset or bias at Nodes C and D has reversed, and the process advances to step 420 without changing the resistance of the first calibration resistor ($R_{CAL1}$) 162.

Steps 410 and 420-426 are repeated to adjust the resistance of the first calibration resistor ($R_{CAL1}$) 162 until the loop counter j reaches the predetermined limit K. If the output of the sense amplifier 166 flips and becomes "1" (i.e., Node D has higher potential than Node C) at step 426 prior to j reaching K, then the resistance of the first calibration resistor ($R_{CAL1}$) 162 may not further increase during the iteration process because the voltage offset or bias at the input terminals of the sense amplifier 166 has been sufficiently minimized.

Figures 8A, 8B:
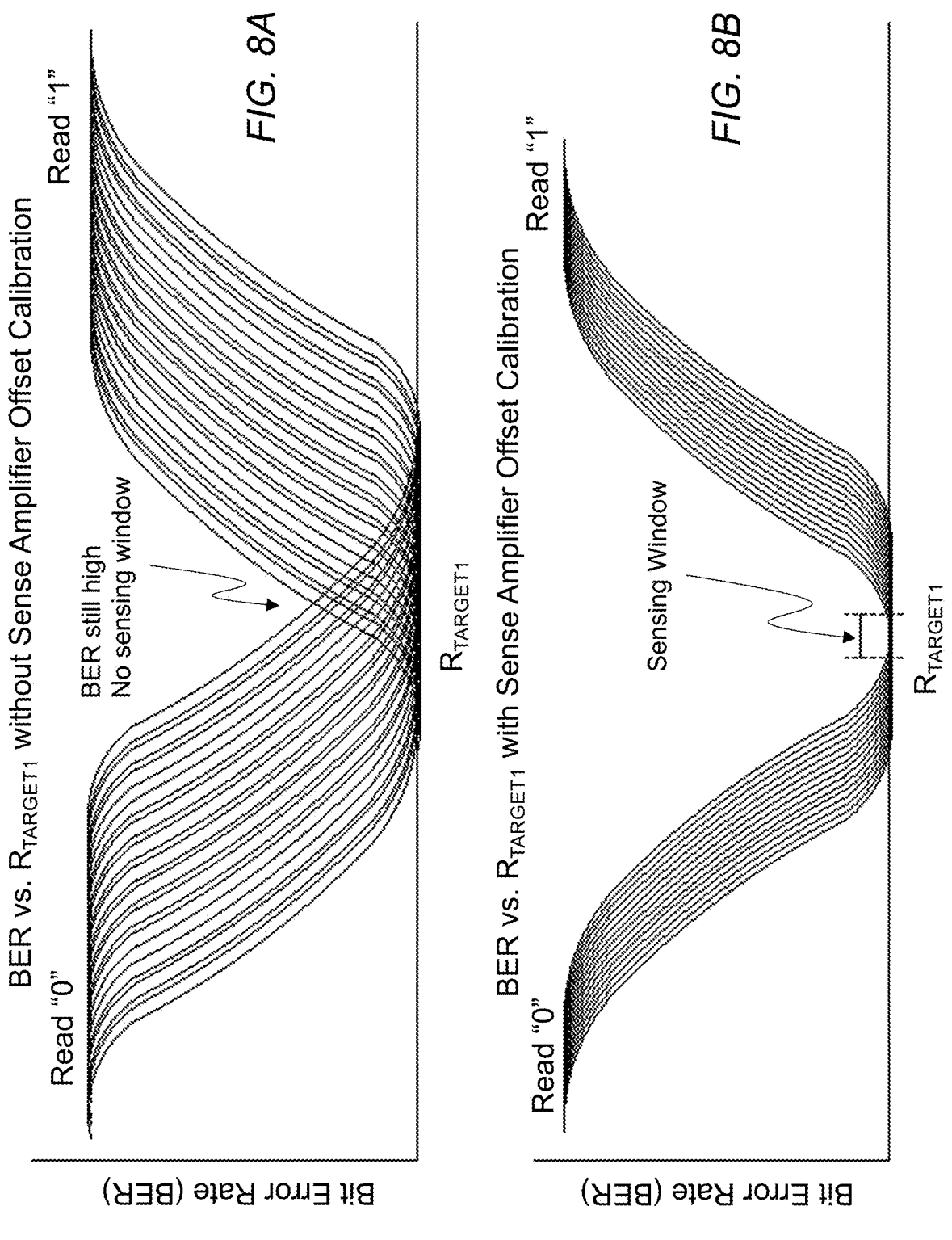
FIGS. 8A and 8B are BER vs. $R_{TARGET1}$ (resistance of the first target resistor) plots for a population of magnetic memory cells without and with prior correction to the sense amplifier offset, respectively.

FIG. 8A is a plot showing bit error rate (BER) versus $R_{TARGET1}$ for a plurality of magnetic memory cells, half of which had been written to $R_L$ (e.g., "1") and the other half of which had been written to $R_H$ (e.g., "0"), without correcting the offset at the input terminals of the sense amplifier 166. Each line in the plot corresponds to $128k$ bits of data. It is evident that the BER curves of the population of memory cells exhibit a wide distribution, which causes the BER to be high regardless of the $R_{TARGET}1$ value.

By contrast, FIG. 8B is another plot showing BER versus $R_{TARGET1}$ for the same plurality of magnetic memory cells with the offset at the input terminals of the sense amplifier 166 corrected according to the process steps 400 described above. The BER curves of the population of memory cells exhibit a much tighter distribution, which provides a window or range of values for setting $R_{TARGET1}$.

After correcting the bias or offset at the input terminals of the sense amplifier 166 by adjusting the resistance of the first or second calibration resistor ($R_{CAL1}$, $R_{CAL2}$) 162, 172 in accordance with the process steps 400, the calibration process may further proceed by adjusting the resistance of the first target resistor ($R_{TARGET1}$) 160, which may function as the reference resistor with its resistance falling somewhere in between the $R_L$ distribution 40 and the $R_H$ distribution 42 as shown in FIG. 2.

Figure 9:
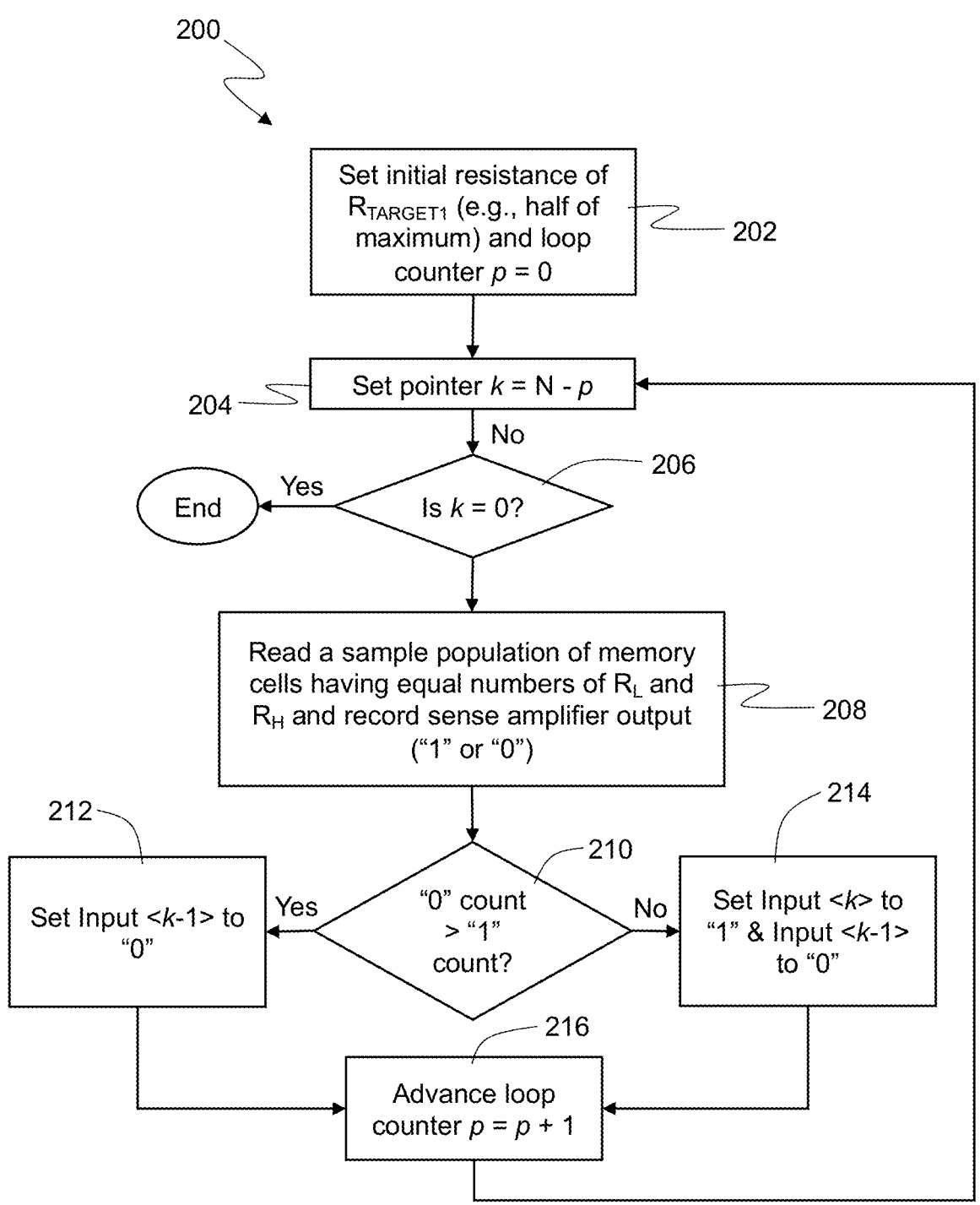
FIG. 9 is a flow diagram illustrating selected steps of an exemplary process for adjusting or calibrating the resistance of the first target resistor of the read circuit of FIG. 5.

FIG. 9 is a flow diagram describing selected steps 200 for calibrating or adjusting the resistance of the first target resistor ($R_{TARGET1}$) 160 in the form of the variable resistance circuit 176 shown in FIG. 6A. The process begins by setting the initial resistance of the first target resistor ($R_{TARGET1}$) 160 to an initial value, which may be approximately half of the maximum resistance (e.g., Input <N>="0" and others set to "1"), and initializing the loop counter (i.e., p=0) at step 202. After step 202, the input pointer (k), which is used to identify the input signal to the first target resistors ($R_{TARGET}1$) 160, is set to equal to N-p at step 204, where N corresponds to the last input signal (i.e., Input <N>) and may be any integer greater than 2. After step 204, the process continues to step 206, where a decision is made as to whether the pointer has reached zero. If so, the calibration process for the first target resistor ($R_{TARGET1}$) 160 will be terminated. Otherwise, the process continues to step 208, where the resistance state of a population of memory cells, half of which had been written to $R_H$ and the other half of which had been written to $R_L$, is sensed using $I_{REA}D$ and $I_{REF}$ as described above. In an embodiment, each cell of the population of memory cells comprises an access transistor coupled to an MTJ in series. The number of MTJs in the population can range from a few tens to the entire first memory array 104A. During the read process, the sense amplifier 166 will output "1" when Node D, which is electrically connected to the positive input terminal of the sense amplifier 166, has a higher voltage than Node C, which is electrically connected to the negative input terminal of the sense amplifier 166. Conversely, the sense amplifier 166 will output "0" when Node C has a higher voltage than Node D. The numbers of "1" and "0" output from the sense amplifier 166 is recorded by a counter.

Next, at step 210, where a decision is made as to whether the number of "0" output from the sense amplifier 166 is greater than the number of "1" output. If so, Input <k-1> of the variable transistor circuit 176 shown in FIG. 6A is set to "0" at step 212. Otherwise, the process advances to step 214, where Input <k> and Input <k-1> are set to "1" and "0," respectively. After step 212 or 214, the loop counter p is incremented by 1 at step 216, after which the process loops back to step 204 to decrement the input pointer k. The loop is repeated until the input pointer, k, becomes zero.

The process steps 200 for adjusting the first target resistor ($R_{TARGET1}$) 160 illustrated in FIG. 9 and described above may be repeated for all memory sectors within an I/O or memory slice. Accordingly, the memory sectors within a memory slice may have different $R_{TARGET1}$ resistance values.

Figure 10:
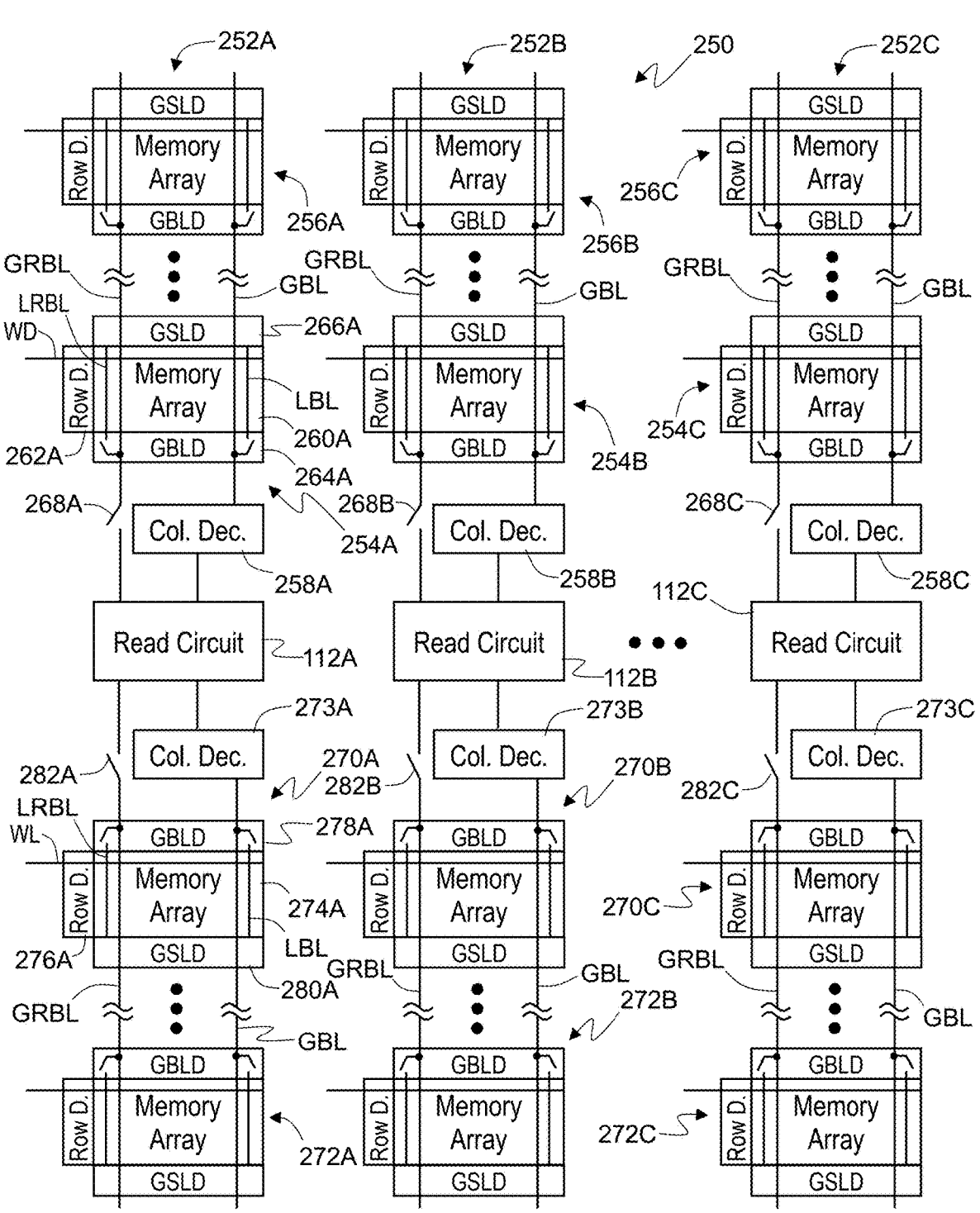
FIG. 10 is a block diagram illustrating components of a memory device in accordance with another exemplary embodiment of the present invention.

FIG. 10 is a block diagram illustrating components of a memory device 250 in accordance with another exemplary embodiment of the present invention. The memory device 250 includes a plurality of I/O or memory slices represented by memory slices 252A-252C. Each of the memory slices 252A-252C has independent input/output from other slices and may include two or more memory sectors. Each memory slice (e.g., 252A) may include a first plurality of memory sectors (e.g., 254A and 256A) electrically connected to a first plurality of global bit lines (GBLs), which may be further electrically connected to a read circuit (e.g., 112A) through a first column decoder (e.g., 258A). Each memory sector (e.g., 254A) includes a memory array (e.g., 260A), a row decoder (e.g., 262A) for selecting a word line (WL)

traversing the memory array 260A along a first direction, a global bit line decoder (GBLD) (e.g., 264A) for connecting a local bit line (LBL) to a respective one of the first plurality of global bit lines (GBLs) traversing the first plurality of memory sectors 254A and 256A along a second direction substantially perpendicular to the first direction, and a global source line decoder (GSLD) (e.g., 266A) for connecting a local source line (not shown) to a respective one of a first plurality of global source lines (not shown) traversing the first plurality of memory sectors 254A and 256A along the second direction.

The memory array 260A is analogous to the first memory array 104A shown in FIG. 5 and includes a plurality of memory cells arranged in rows and columns (not shown), a plurality of parallel word lines (WLs), a plurality of local bit lines (LBLs), and a plurality of local source lines (not shown). The memory array 260A may also include a local reference bit line (LRBL) electrically connected to a first global reference bit line (GRBL) through the global bit line decoder (GBLD) 264A. The first global reference bit line (GRBL) may be electrically connected to the read circuit 112A through a first switch 268A. The first global reference bit line (GRBL) may provide a reference signal or current to the read circuit 112A when sensing the resistance state of a memory cell in the first plurality of memory sectors 254A and 256A. Other memory sectors in the first plurality of memory sectors may be substantially identical to the memory sector 254A.

Each memory slice (e.g., 252A) may further include a second plurality of memory sectors (e.g., 270A and 272A) electrically connected to a second plurality of global bit lines (GBLs), which may be further electrically connected to the read circuit (e.g., 112A) through a second column decoder (e.g., 273A). Like the first plurality of memory sectors 254A and 256A, each of the second plurality of memory sectors (e.g., 270A) includes a memory array (e.g., 274A), a row decoder (e.g., 276A) for selecting a word line (WL) traversing the memory array 274A along a first direction, a global bit line decoder (GBLD) (e.g., 278A) for connecting a local bit line (LBL) to a respective one of a second plurality of global bit lines (GBLs) traversing the second plurality of memory sectors 270A and 272A along a second direction substantially perpendicular to the first direction, and a global source line decoder (GSLD) (e.g., 280A) for connecting a local source line (not shown) to a respective one of a second plurality of global source lines (not shown) traversing the second plurality of memory sectors 270A and 272A along the second direction. The memory sector 270A may also include a local reference bit line (LRBL) electrically connected to a second global reference bit line (GRBL) through the global bit line decoder (GBLD) 278A. The second global reference bit line (GRBL) traverses the second plurality of memory sectors 270A and 272A along the second direction and connects local reference bit lines of the second plurality of memory sectors 270A and 272A to the read circuit 112A via a second switch 282A. The second global reference bit line (GRBL) may provide a reference signal or current to the read circuit 112A when sensing the resistance state of a memory cell in the second plurality of memory sectors 270A and 272A. Other memory sectors in the second plurality of memory sectors may be substantially identical to the memory sector 270A. Moreover, the first and second plurality of memory sectors may be physically arranged in a mirror-image geometry on opposite sides of the read circuit 112A that acts as the mirror line.

Figure 11:
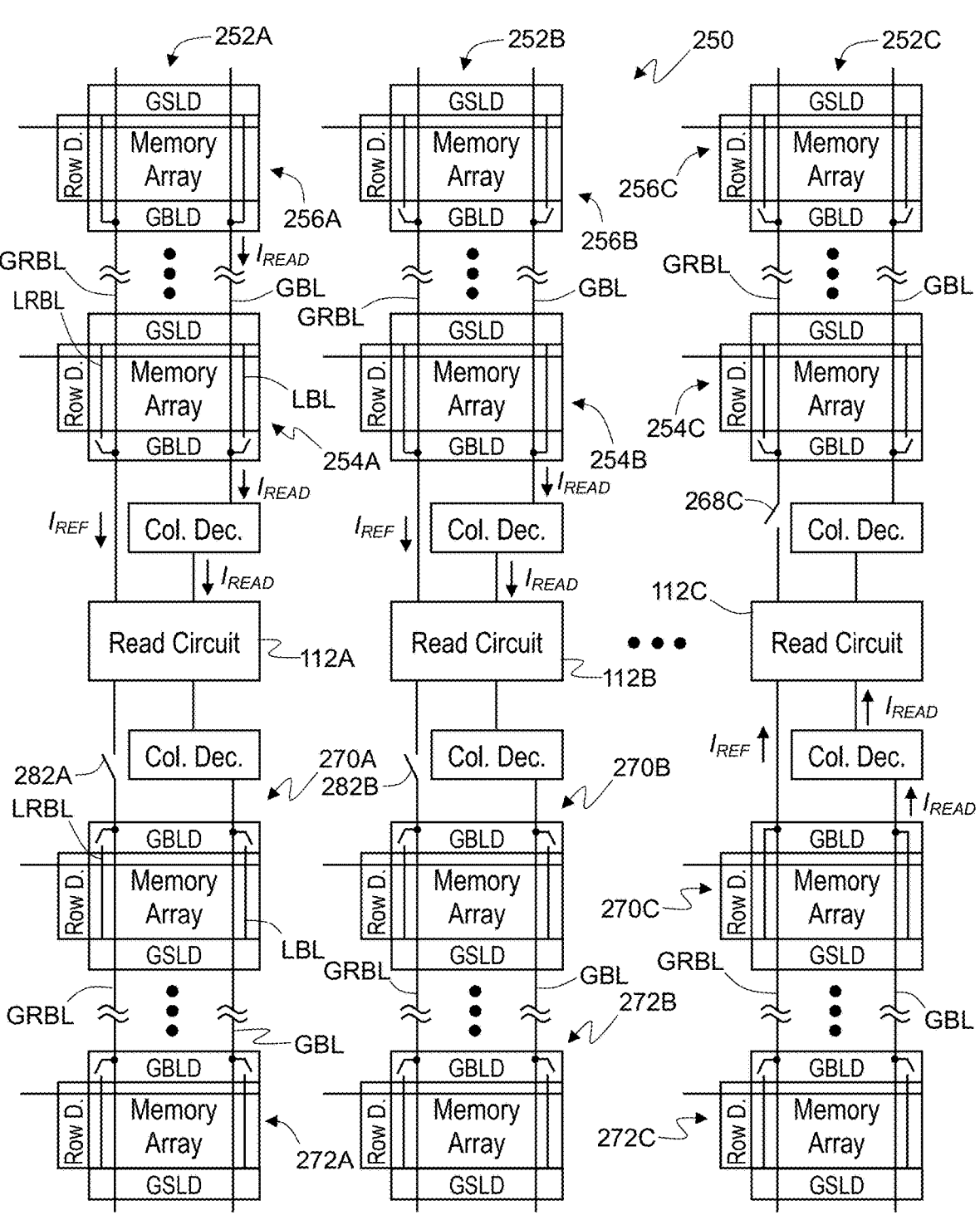
FIG. 11 is a diagram illustrating an example of read and reference current paths for the memory device of FIG. 10 in a read operation.

Since each of the memory slices 252A-252C includes a respective one of the read circuits 112A-112C, a memory cell from each of the memory slices 252A-252C may be independently read at the same time. For example and without limitation, FIG. 11 shows that a memory cell from the memory sector 256A of the first memory slice 252A, another memory cell from the memory sector 254B of the second memory slice 252B, and still another memory cell from the memory sector 270C of the last memory slice 252C are simultaneously read. During the sensing or read operation, the read current, $I_{READ}$, passes through the memory cell selected for the read operation, the local bit line (LBL) electrically connected to the selected memory cell, and the global bit line (GBL) electrically connected to the local bit line (LBL), and reaches the read circuit via the first or second column decoder, while the reference current ($I_{REF}$) passes through the local reference bit line (LRBL) and the global reference bit line (GRBL) to reach the read circuit via the first or second switch.

Figure 12:
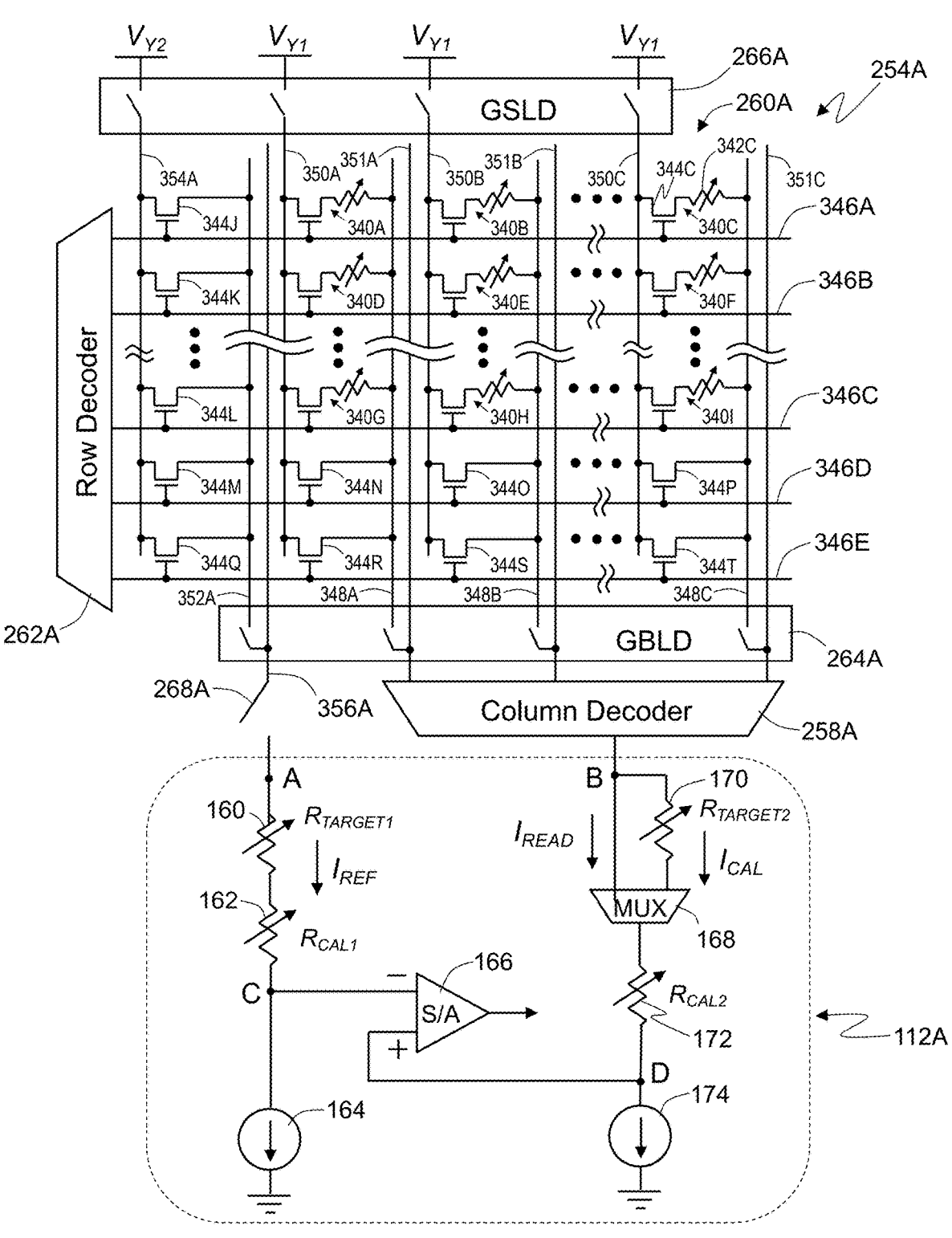
FIG. 12 is a schematic circuit diagram for a memory sector and a read circuit of the memory device of FIG. 10.

FIG. 12 is schematic circuit diagram showing the memory sector 254A, the first column decoder 258A, the first switch 268A, and the read circuit 112A of the first memory slice 252A. The memory sector 254A includes the memory array 260A, the row decoder 262A, the global bit line decoder (GBLD) 264A, the global source line decoder (GSLD) 266A. The memory array 260A includes a plurality of memory cells arranged in rows and columns as represented by cells 340A-340I, a plurality of word lines represented by lines 346A-346C, a plurality of local bit lines represented by lines 348A-348C, and a plurality of local source lines represented by lines 350A-350C. Each memory cell (e.g., 340C) includes a resistance-switching memory element (e.g., 342C) and an access transistor (e.g., 344C) coupled in series between a respective one of the local bit lines (e.g., 348C) and a respective one of the local source lines (e.g., 350C). Each of the plurality of word lines 346A-346C is coupled to the gates of a respective row of the access transistors in a first direction. Each of the plurality of local bit lines 348A-348C is coupled to a respective column of the memory cells 340A-340I at one end thereof (e.g., memory element) along a second direction. Each of the plurality of local source lines 350A-350C is coupled to a respective column of the memory cells 340A-340I at the other end thereof (e.g., access transistor) along the second direction. The first and second directions may be substantially orthogonal to each other. The positions of the resistance-switching memory element (e.g., 342C) and the access transistor (e.g., 344C) in a memory cell (e.g., 340C) may be swapped such that the memory element (e.g., 342C) and the access transistor (e.g., 344C) are disposed adjacent to the local source line (e.g., 350C) and the local bit line (e.g., 348C), respectively. At the global bit line decoder (GBLD) 264A, each of the plurality of local bit lines 348A-348C may be electrically connected to a respective one of the first plurality of global bit lines 351A-351C traversing the first plurality of memory sectors 254A and 256A along the second direction. The first plurality of global bit lines 351A-351C may be electrically connected to the read circuit 112A at Node B through the first column decoder 258A. At the global source line decoder (GSLD) 266A, each of the plurality of local source lines 350A-350C may be electrically connected to a respective one of the first plurality of global source lines (not shown) traversing the first plurality of memory sectors 254A and 256A along the second direction.

Each of the resistance-switching memory elements (e.g., 342C) may change the resistance state thereof by any suitable switching mechanism, such as but not limited to phase change, precipitate bridging, magnetoresistive switching, or any combination thereof. In one embodiment, the memory element 342C comprises a phase change chalcogenide compound, such as but not limited to $Ge_2Sb_2Te_5$ or AgInSbTe, which can switch between a resistive phase and a conductive phase. In another embodiment, the memory element 342C comprises a nominally insulating metal oxide material, such as but not limited to NiO, $TiO_2$, or $Sr(Zr)TiO_3$, which can switch to a lower electrical resistance state as metal rich precipitates grow and link to form conductive paths upon application of an appropriate voltage. In still another embodiment, the memory element 342C comprises a magnetic free layer, a magnetic reference layer, and an insulating electron tunnel junction layer interposed therebetween, which collectively form a magnetic tunnel junction (MTJ). When a switching current is directly applied to the MTJ, the magnetic free layer would switch the magnetization direction thereof, thereby changing the electrical resistance of the MTJ. The magnetic free layer may have a variable magnetization direction substantially perpendicular to a layer plane thereof. The magnetic reference layer may have a fixed magnetization direction substantially perpendicular to a layer plane thereof. Alternatively, the magnetization directions of the magnetic free and reference layers may be oriented parallel to the respective layer planes.

The memory array 260A further includes a column of access transistors 344J-344L with the gate of each access transistor coupled to a respective one of the word lines 346A-346C. The column of access transistors 344J-344L, which are used to control the reference current during sensing, can be regarded as "dummy" cells without memory elements. The column of access transistors 344J-344L are coupled to a local reference bit line 352A at one of the source and drain and to a local reference source line 354A at the other one of the source and drain. The local reference bit line 352A may be electrically connected to the first global reference bit line 356A, which in turn may be electrically connected to the read circuit 112A at Node A through the first switch 268A. The memory array 260A may further include one or more rows of access transistors (dummy cells) 344M-344T electrically connected to one or more word lines (dummy word lines) 346D and 346E at the gates thereof. Each transistor of the rows of the access transistors 344M-344T is electrically connected to a respective one of the local bit lines 348A-348C or the local reference bit line 352A at one of the source and drain and to a respective one of the local source lines 350A-350C or the local reference source line 354A at the other one of the source and drain. It may not be necessary for all memory sectors connected to the read circuit 112A to include the one or more rows of the access transistors 344M-344T since these dummy cells are used to allow the calibration current to bypass the memory cells 340A-340I when calibrating the bias or offset at the input terminals of the sense amplifier 166 as described above and will be described in more detail below.

All of the word lines 346A-346E may be electrically connected to the row decoder 262A, which allows one the word line 346A-346E to be selected for read or write operation. A voltage ($V_{Y1}$) may be applied to the local source lines 350A-350C from the first plurality of global source lines (not shown) via the global source line decoder (GSLD) 266A during the read or write operation. Similarly, another voltage (e.g., $V_{Y2}$) may be applied to the local reference source line 354A from the first global reference source line (not shown) via the global source line decoder (GSLD) 266A. In an embodiment, the voltages $V_{Y1}$ and $V_{Y2}$ are set to the same voltage ($V_{READ}$) during the read operation and calibration of the read circuit 112A. The first column decoder 258A electrically connected to the first plurality of global bit lines 351A-351C allows one of the global bit lines 351A-351C to be electrically connected to Node B of the read circuit 112A. Likewise, the first global reference bit line 356A, which provides the reference signal in the read operation, may be electrically connected to Node A of the read circuit 112A via the first switch 268A.

In a read operation, a read voltage (i.e., $V_{READ}$) is applied to a selected one of the first plurality of global source lines (not shown), causing a read current ($I_{READ}$) to flow from the selected global source line through the global source line decoder (GSLD) 266A, a respective one of the local source lines (e.g., 350C) electrically connected to the selected global source line, a memory cell (e.g., 340C) electrically connected to the local source line 350C and a selected word line (e.g., 346A), a local bit line (e.g., 348C) electrically connected to the selected memory cell 340C, the global bit line decoder (GBLD) 264A, a respective one of the first plurality of global bit lines (e.g., 351C), and the first column decoder 258A, to Node B of the read circuit 112A. Meanwhile, a reference voltage that is identical or substantially identical to the read voltage (e.g., $V_{READ}$) may be applied to the first global reference source line (not shown), thereby causing a reference current (IREF) to flow from the first global reference source line through the global source line decoder (GSLD) 266A, the local reference source line 354A, one of the column of access transistors (e.g., 344J) electrically connected to the selected word line 346A, the local reference bit line 352A, the global bit line decoder (GBLD) 264A, the first global reference bit line 356A, and the first switch 268A, to Node A of the read circuit 112A. The reference current ($I_{REF}$) does not pass through any of the memory cells (340A-340I).

In a calibration operation, a calibration voltage (i.e., $V_{READ}$) is applied to a selected one of the first plurality of global source lines (not shown), causing a calibration current ($I_{CAL}$) to flow from the selected global source line through the global source line decoder (GSLD) 266A, a respective one of the local source lines (e.g., 350C) electrically connected to the selected global source line, an access transistor (e.g., 344P) of the rows of access transistors 344M-344T electrically connected to the selected local source line 350C and a selected word line (e.g., 346D), a local bit line (e.g., 348C) electrically connected to the selected access transistor 344P, the global bit line decoder (GBLD) 264A, a respective one of the first plurality of global bit lines (e.g., 351C), and the first column decoder 258A, to Node B of the read circuit 112A. Meanwhile, a reference voltage that is substantially identical to the calibration voltage (e.g., $V_{READ}$) may be applied to the first global reference source line (not shown), thereby causing a reference current ($I_{REF}$) to flow from the first global reference source line through the global source line decoder (GSLD) 266A, the local reference source line 354A, an access transistor (e.g., 344M) of the rows of access transistors 344M-344T electrically connected to the local reference source line 354A and the selected word line 346D, the local reference bit line 352A, the global bit line decoder (GBLD) 264A, the first global reference bit line 356A, and the first switch 268A, to Node A of the read circuit 112A. Neither the calibration current ($I_{CAL}$) nor the reference current ($I_{REF}$) passes through any of the memory cells (340A-340I).

With continuing reference to FIG. 12, the read circuit 112A and its calibration and operation are substantially similar to that of the read circuit 112A shown in FIGS. 5-9 and described above.

When a computing device incorporating therein the non-volatile memory device 100 or 250 is powered up, the correction of the bias or offset at the input terminals of the sense amplifier 166 for each read circuit (e.g., 112A), as illustrated in FIG. 7 and described above, may be performed and be a part of the built-in self-test (BIST). The adjustment or calibration of the first target resistor 160 may also be executed for one or more memory sectors after the bias or offset at the input terminals of the sense amplifier is corrected or compensated during the powered-up process. The process of adjusting or calibrating the first target resistor 160 may include the steps of reading a sample population of magnetic memory cells having substantially equal numbers of magnetic memory cells in low and high resistance states, and adjusting the resistance of the first target resistor until an output of the sense amplifier 166 shows that the sample population of magnetic memory cells having substantially equal numbers of magnetic memory cells in the low and high resistance states, as illustrated in FIG. 9 and described above.

The correction of the bias or offset at the input terminals of the sense amplifier 166 may also be executed with each read command for reading one or more bits of data. After receiving such read command by the nonvolatile memory device 100 or 250, the sense amplifier(s) 166, which is/are electrically connected to the one or more memory cells storing the one or more bits of data for reading, may be first calibrated or compensated according to the process steps 400 illustrated in FIG. 7 and described above prior to actual sensing the resistance state of each of the one or more memory cells by flowing a read current ($I_{READ}$) through each of the one or more memory cells, the second calibration resistor 172, the second input terminal of the sense amplifier 166, and the second current source 174 in series, and sensing the resistance state of the each of the one or more memory cells by determining the potential difference between the first and second input terminals of the sense amplifier 166 as described above.

While the present invention has been shown and described with reference to certain preferred embodiments, it is to be understood that those skilled in the art will no doubt devise certain alterations and modifications thereto which nevertheless include the true spirit and scope of the present invention. Thus the scope of the invention should be determined by the appended claims and their legal equivalents, rather than by examples given.

Any element in a claim that does not explicitly state "means for" performing a specified function, or "step for" performing a specific function, is not to be interpreted as a "means" or "step" clause as specified in 35 U.S.C. § 112, ¶6. In particular, the use of "step of" in the claims herein is not intended to invoke the provisions of 35 U.S.C. § 112, ¶6.

What is claimed is:

1. A method for operating a magnetic memory device comprising the steps of:

providing a read circuit electrically connected to an array of cells, the read circuit including a sense amplifier having first and second input terminals;

setting resistances of first and second target resistors in the read circuit to a same value;

setting resistances of first and second calibration resistors in the read circuit to a same minimum value;

flowing a reference current through the first target resistor, the first calibration resistor, the first input terminal, and a first current source in series;

flowing a calibration current through the second target resistor, the second calibration resistor, the second input terminal, and a second current source in series;

determining a potential difference between the first and second input terminals; and if the second input terminal has a higher potential than the first input terminal, incrementally increasing the resistance of the second calibration resistor until the first input terminal has a higher potential than the second input terminal, or else if the first input terminal has a higher potential than the second input terminal, incrementally increasing the resistance of the first calibration resistor until the second input terminal has a higher potential than the first input terminal.

2. The method of claim 1 further comprising the steps of:

after incrementally increasing the resistance of the first or second calibration resistor, reading a sample population of magnetic memory cells having substantially equal numbers of magnetic memory cells in low and high resistance states; and adjusting the resistance of the first target resistor until an output of the sense amplifier shows that the sample population of magnetic memory cells having substantially equal numbers of magnetic memory cells in the low and high resistance states.

3. The method of claim 1, wherein the first and second calibration resistors each comprise a sequence of sub-circuits connected in series with each sub-circuit including a transistor and a resistor connected in parallel, a resistance value of the resistor doubling in a successive sub-circuit.

4. The method of claim 1, wherein the first and second target resistors each comprise a sequence of sub-circuits connected in series with each sub-circuit including a transistor and a resistor connected in parallel, a resistance value of the resistor doubling in a successive sub-circuit.

5. The method of claim 1, wherein the array of cells includes a plurality of magnetic memory cells arranged in rows and columns, each of the magnetic memory cells including an access transistor and a magnetic tunnel junction (MTJ) coupled in series between a respective one of a plurality of source lines and a respective one of a plurality of bit lines.

6. The method of claim 5, wherein the array of cells further includes a row of transistors, each of the row of transistors is electrically connected to a respective one of the plurality of source lines at one of source and drain and a respective one of the plurality of bit lines at the other one of source and drain.

7. The method of claim 6, wherein the calibration current passes through one of the row of transistors and bypasses the plurality of magnetic memory cells.

8. A method for operating a magnetic memory device comprising the steps of:

providing a read circuit electrically connected to an array of cells, the read circuit including a sense amplifier having first and second input terminals;

receiving a read command for sensing a resistance state of a magnetic memory cell in the array of cells;

setting resistances of first and second target resistors in the read circuit to a same value;

setting resistances of first and second calibration resistors in the read circuit to a same minimum value;

flowing a reference current through the first target resistor, the first calibration resistor, the first input terminal, and a first current source in series;

flowing a calibration current through the second target resistor, the second calibration resistor, the second input terminal, and a second current source in series;

determining a potential difference between the first and second input terminals by the sense amplifier;

if the second input terminal has a higher potential than the first input terminal, incrementally increasing the resistance of the second calibration resistor until the first input terminal has a higher potential than the second input terminal, or else if the first input terminal has a higher potential than the second input terminal, incrementally increasing the resistance of the first calibration resistor until the second input terminal has a higher potential than the first input terminal;

flowing a read current through the magnetic memory cell, the second calibration resistor, the second input terminal, and the second current source in series; and sensing the resistance state of the magnetic memory cell by determining another potential difference between the first and second input terminals.

9. The method of claim 8, wherein the read current bypasses the second target resistor.

10. The method of claim 8, wherein the array of cells includes a plurality of magnetic memory cells arranged in rows and columns, each of the magnetic memory cells including an access transistor and a magnetic tunnel junction (MTJ) coupled in series between a respective one of a plurality of source lines and a respective one of a plurality of bit lines.

11. The method of claim 10, wherein the reference current and calibration current bypass the plurality of magnetic memory cells.

12. A magnetic memory device comprising an array of cells and a read circuit electrically connected thereto, the read circuit comprising:

a first input node through which a reference current passes;

a second input node through which a calibration current or a read current passes;

a sense amplifier having first and second input terminals;

a first target resistor and a first calibration resistor electrically connected in series between the first input node and the first input terminal of the sense amplifier;

a first current source electrically connected to the first input terminal of the sense amplifier at one end and ground at the other end;

a multiplexer having a first input terminal electrically connected to the second input node and having a substantially same potential as the input node, a second input terminal, and an output terminal;

a second target resistor electrically connected to the second input node at one end and the second input terminal of the multiplexer at the other end;

a second calibration resistor electrically connected to the output terminal of the multiplexer at one end and the second input terminal of the sense amplifier the at the other end; and a second current source electrically connected to the second calibration resistor at one end and ground at the other end.

13. The magnetic memory device of claim 12, wherein in a calibration process of the read circuit, resistances of the first and second target resistors are set to a same value, resistances of the first and second calibration resistors are set to a same minimum value, the reference current is flowed through the first target resistor and the first calibration resistor, the calibration current is flowed through the second target resistor and the second calibration resistor, the potential difference between the first and second input terminals of the sense amplifier is determined, if the second input terminal of the sense amplifier has a higher potential than the first input terminal of the sense amplifier, the resistance of the second calibration resistor is incrementally increased until the first input terminal of the sense amplifier has a higher potential than the second input terminal of the sense amplifier, or else if the first input terminal of the sense amplifier has a higher potential than the second input terminal of the sense amplifier, the resistance of the first calibration resistor is incrementally increased until the second input terminal of the sense amplifier has a higher potential than the first input terminal of the sense amplifier.

14. The magnetic memory device of claim 12, wherein the first and second calibration resistors each comprise a sequence of sub-circuits connected in series with each sub-circuit including a transistor and a resistor connected in parallel, a resistance value of the resistor doubling in a successive sub-circuit.

15. The magnetic memory device of claim 12, wherein the first and second target resistors each comprise a sequence of sub-circuits connected in series with each sub-circuit including a transistor and a resistor connected in parallel, a resistance value of the resistor doubling in a successive sub-circuit.

16. The magnetic memory device of claim 12, wherein the read current bypasses the second target resistor.

17. The magnetic memory device of claim 12, wherein the array of cells includes a plurality of magnetic memory cells arranged in rows and columns, each of the magnetic memory cells including an access transistor and a magnetic tunnel junction (MTJ) coupled in series between a respective one of a plurality of source lines and a respective one of a plurality of bit lines.

18. The magnetic memory device of claim 17, wherein the array of cells further includes a column of transistors, the column of transistors are electrically connected to a respective one of the plurality of source lines at one of source and drain and a respective one of the plurality of bit lines at the other one of source and drain.

19. The magnetic memory device of claim 17, wherein the array of cells further includes a row of transistors, each of the row of transistors is electrically connected to a respective one of the plurality of source lines at one of source and drain and a respective one of the plurality of bit lines at the other one of source and drain.

20. The magnetic memory device of claim 19, wherein the calibration current flows through one of the row of transistors and bypasses the plurality of magnetic memory cells.

* * * * *